(12) United States Patent
Ozeki et al.

(10) Patent No.: US 9,673,357 B2
(45) Date of Patent: Jun. 6, 2017

(54) LIGHT EMITTING DEVICE PACKAGE

(71) Applicant: LG Innotek Co., Ltd., Seoul (KR)

(72) Inventors: Satoshi Ozeki, Seoul (KR); Yuichiro Tanda, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/953,254

(22) Filed: Nov. 27, 2015

(65) Prior Publication Data

US 2016/0155907 A1  Jun. 2, 2016

(30) Foreign Application Priority Data

Nov. 28, 2014 (KR) .................. 10-2014-0167951
Nov. 28, 2014 (KR) .................. 10-2014-0167952

(51) Int. Cl.
  *H01L 33/60* (2010.01)
  *H01L 33/62* (2010.01)
  *H01L 33/48* (2010.01)
  *H01L 33/46* (2010.01)

(52) U.S. Cl.
  CPC .......... *H01L 33/483* (2013.01); *H01L 33/486* (2013.01); *H01L 33/60* (2013.01); *H01L 33/62* (2013.01); *H01L 33/46* (2013.01); *H01L 2224/48091* (2013.01); *H01L 2224/48247* (2013.01); *H01L 2224/97* (2013.01); *H01L 2924/16195* (2013.01)

(58) Field of Classification Search
  CPC ....... H01L 33/483; H01L 33/60; H01L 33/62; H01L 33/486
  See application file for complete search history.

(56) References Cited

U.S. PATENT DOCUMENTS

| 2001/0013756 A1* | 8/2001 | Mori ...................... H05B 33/04 313/512 |
| 2011/0109222 A1* | 5/2011 | Inoue ...................... H01L 33/60 313/503 |

(Continued)

FOREIGN PATENT DOCUMENTS

| CN | 104037280 A | 9/2014 |
| EP | 2 523 230 A2 | 11/2012 |

(Continued)

*Primary Examiner* — Fazli Erdem
(74) *Attorney, Agent, or Firm* — Birch, Stewart, Kolasch & Birch, LLP

(57) ABSTRACT

An embodiment relates to a light-emitting device package. In an embodiment, the light-emitting device package includes a package body configured to include a top surface, a plate guide unit disposed on the top surface, and a cavity formed in the top surface, a light-emitting device disposed within the cavity, a plate disposed on the top surface of the package body and guided by the plate guide unit, and an adhesive member disposed between the top surface of the package body and the plate. The adhesive member includes a base layer made of a flexible material, a first adhesive tape disposed between the base layer and the top surface of the package body and bonded to the base layer and the top surface of the package body, and a second adhesive tape disposed between the base layer and the plate and bonded to the base layer and the plate.

9 Claims, 19 Drawing Sheets

(56) References Cited

U.S. PATENT DOCUMENTS

| | | | | |
|---|---|---|---|---|
| 2011/0122651 A1* | 5/2011 | Komano | | G02B 6/002 362/611 |
| 2012/0181571 A1* | 7/2012 | Park | | H01L 24/27 257/99 |
| 2012/0286319 A1* | 11/2012 | Lee | | H01L 33/642 257/99 |
| 2013/0126927 A1* | 5/2013 | Iguchi | | H01L 33/60 257/98 |
| 2013/0207131 A1* | 8/2013 | Jeong | | H01L 51/5259 257/88 |
| 2014/0110745 A1* | 4/2014 | Lee | | H01L 33/62 257/99 |
| 2014/0175389 A1* | 6/2014 | Xiong | | H01L 51/5246 257/40 |
| 2015/0219943 A1* | 8/2015 | Noh | | G02F 1/13338 349/61 |
| 2015/0355506 A1* | 12/2015 | Kim | | G02B 6/0073 362/607 |
| 2015/0362652 A1* | 12/2015 | Hayashi | | G02B 6/005 362/607 |
| 2016/0013377 A1* | 1/2016 | Ozeki | | H01L 33/486 257/48 |
| 2016/0013382 A1* | 1/2016 | Ozeki | | H01L 33/60 257/98 |
| 2016/0126426 A1* | 5/2016 | Kim | | H01L 33/486 257/98 |
| 2016/0376470 A1* | 12/2016 | Hirose | | C09J 7/0217 428/220 |

FOREIGN PATENT DOCUMENTS

| | | | |
|---|---|---|---|
| JP | 2013-251384 | * | 12/2013 |
| KR | 10-2013-0101467 A | | 9/2013 |
| WO | WO 2008/117685 A1 | | 10/2008 |

* cited by examiner

LIGHT EMITTING DEVICE PACKAGE

CROSS REFERENCE TO RELATED APPLICATION

The present application claims the benefit of Korean Patent Application Nos. 10-2014-0167951 and 10-2014-0167952 filed in the Korean Intellectual Property Office on Nov. 28, 2014, the entire contents of which are incorporated herein by reference.

BACKGROUND OF THE INVENTION

1. Technical Field

An embodiment of the present invention relates to a light-emitting device package.

2. Description of the Related Art

A light-emitting diode (LED) is a high-efficiency and eco-friendly light source and has been in the spotlight in various fields. The LED is being used in various fields, such as a display device, optical communication, vehicles, and common lights. In particular, the demand for a white LED implementing white light is gradually increased.

After fabricated, an LED is packaged along with other parts and used. This is called an LED package. In a known LED package, an LED chip is mounted on a resin package including a heat dissipater, and a glass plate disposed on the LED chip is coupled to the resin package through adhesives. The adhesives are cured by heat or UV rays, and an accurate amount of adhesives suitable for a corresponding LED package is required.

If the amount of the adhesives is more than or less than a reference value, there is a possibility of a curing failure or the generation of a gap between the resin package and the glass plate. Furthermore, although the adhesives have been cured, it may be difficult to check whether the adhesives have been accurately cured. Furthermore, an electronic part, such as an LED, is greatly influenced by water. An electronic part may be deteriorated or corroded by water. Furthermore, if the adhesives are cured by heat or UV rays, it may be load on other parts within an LED package. Such a load may be one of causes which make the entire LED package a failure. Furthermore, if the adhesives are cured by heat or UV rays, not a little curing process of the adhesives is required, and handling is difficult. Furthermore, if heat is applied to an empty space formed in the adhesives after the adhesives are cured, there is a possibility that a crack may be generated in the adhesives.

In a known light-emitting device package, a light-emitting chip is mounted on a resin package body including a heat dissipater. The light-emitting chip is electrically connected to leads through wires, the top of the light-emitting chip is filled with resin and a sealant, such as silicon, and a lens is provided on the top of the results. The light-emitting device package having such a structure has a low heat dissipation effect because the transfer of heat generated when a light-emitting device is driven is slow. Accordingly, the optical characteristics of the light-emitting device may be deteriorated, and it is difficult to expect rapid process speed for a package process for inserting the heat dissipater into the resin package body. If the light-emitting device is mounted on a lead frame without a heat dissipater, there are problems in that heat dissipation performance is low because heat is dissipated through the lead frame and it is difficult to apply the light-emitting device to a high-output light-emitting device. Furthermore, if a resin package used in a lead frame for a light-emitting device is exposed to light for a long time, there is a problem in that optical characteristics are deteriorated because the resin package is discolored or altered.

SUMMARY OF THE INVENTION

In an embodiment, the light-emitting device package comprises a package body configured to include a top surface, a plate guide unit disposed on the top surface, and a cavity formed in the top surface, a light-emitting device disposed within the cavity, a plate disposed on the top surface of the package body and guided by the plate guide unit, and an adhesive member disposed between the top surface of the package body and the plate. The adhesive member includes a base layer made of a flexible material, a first adhesive tape disposed between the base layer and the top surface of the package body and bonded to the base layer and the top surface of the package body, and a second adhesive tape disposed between the base layer and the plate and bonded to the base layer and the plate.

In another embodiment, the light-emitting device package comprises a package body configured to comprise a top surface, a plate guide unit disposed on the top surface, and a cavity formed in the top surface; a light-emitting device disposed within the cavity; a plate disposed on the top surface of the package body and guided by the plate guide unit; and an external adhesive member disposed on the plate guide unit and the plate, wherein the external adhesive member comprises: a base layer made of a flexible material; and an adhesive tape disposed below the base layer and bonded to the plate guide unit and the plate.

In another embodiment, the light-emitting device package comprises a light-emitting device; a lead frame configured to have the light-emitting device disposed in the lead frame; a reflector layer disposed on the lead frame and configured to reflect light emitted by the light-emitting device; and a resin package configured to surround the lead frame and the reflector layer, wherein the reflector layer comprises an inclined surface configured to perform regular reflection on the light emitted by the light-emitting device, and an angle between the inclined surface and a bottom surface of the reflector layer is 25 degrees or more to 35 degrees or less.

An embodiment provides a light-emitting device package capable of preventing water or an alien substance from entering between a package body and a plate.

An embodiment provides a light-emitting device package in which an adhesive member can be stably bonded to the package body and the plate although the adhesion surface of the package body coming in contact with the adhesive member and/or the adhesion surface of the plate coming in contact with the adhesive member are not flat.

An embodiment provides a light-emitting device package not requiring a heat curing process or UV curing process for curing the adhesive member.

An embodiment provides a light-emitting device package capable of improving an adhesion property between a lead frame and a resin package.

An embodiment provides a light-emitting device package capable of preventing the infiltration of water or an alien substance from the bottom.

An embodiment provides a light-emitting device package capable of preventing an alien substance, generated when a light-emitting device is mounted, from being penetrated.

An embodiment provides a light-emitting device package capable of stably fixing a reflector on the lead frame.

An embodiment provides a light-emitting device package capable of optionally mounting the lens or the plate on the reflector.

An embodiment provides a light-emitting device package which can be stably coupled to a lead frame prototype and can be easily separated from the lead frame prototype.

An embodiment provides a light-emitting device package which can be stably coupled to the lead frame prototype without adhesives by increasing a friction force with the lead frame prototype.

An embodiment provides a light-emitting device package capable of improving optical output.

An embodiment provides a light-emitting device package capable of improving optical extraction speed.

An embodiment provides a light-emitting device package in which a backlight spot is not generated in a reflector layer.

An embodiment provides a light-emitting device package capable of improving light directivity.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
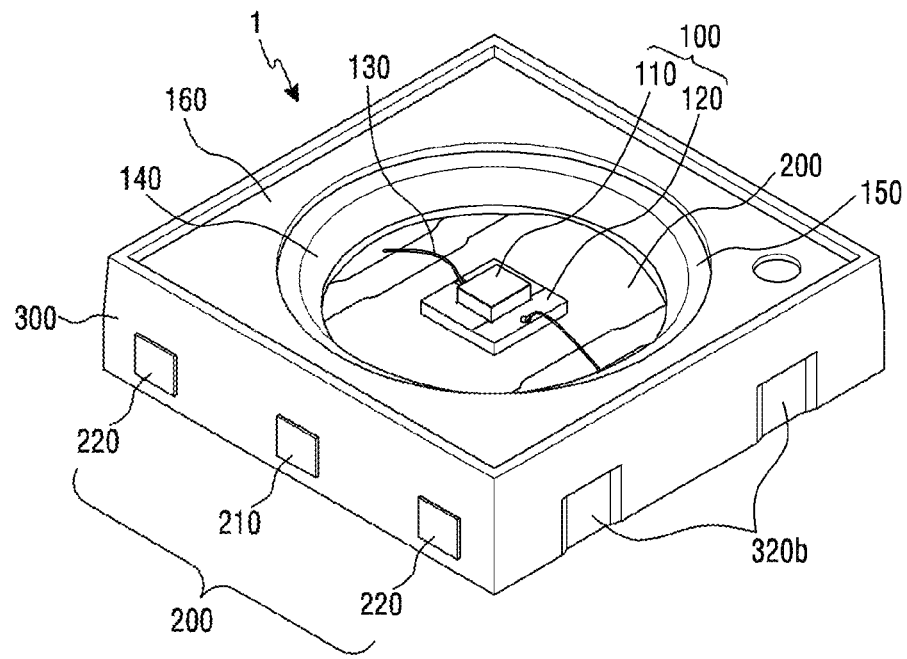
FIG. 1 is a perspective view of a light-emitting device package according to an embodiment.

In the drawings, the thickness or size of each layer has been enlarged, omitted, or schematically shown for convenience and clarity of description. Furthermore, an actual size is not entirely incorporated into the size of each element.

In describing the embodiments of the present invention, if one element is said to be formed "on (over) or below (under)" the other element, the term on (over) or below (under) includes that the two elements have a direct come in contact with each other or one or more other elements are disposed between the two elements (indirectly). Furthermore, if "on (over) or below (under)" is expressed, it may include the meaning of an upward direction or a downward direction on the basis of one element.

A light-emitting device package according to an embodiment of the present invention is described below.

FIG. 1 is a perspective view of a light-emitting device package according to an embodiment.

Referring to FIG. 1, the light-emitting device package 1 according to an embodiment include a light-emitting device 100 configured to include a light-emitting chip 110 and a sub-mount 120 on which the light-emitting chip 110 is mounted, a lead frame 200 configured to have the light-emitting device 100 mounted thereon, wires 130 configured to electrically connect the light-emitting device 100 and the lead frame 200, a reflector layer 140 configured to surround the surroundings of the light-emitting device 100 and to reflect light emitted by the light-emitting device 100, and a resin package 300 configured to form the main body of the light-emitting device package 1.

The light-emitting device 100 may be an LED, but is not limited thereto. The LED may be a deep ultraviolet (DUV) LED emitting DUV rays, but is not limited thereto. For example, the LED may be a red, green, blue, or white LED which respectively emits red, green, blue, or white. The LED is kind of a solid device which converts electric energy into light. In general, the LED includes an active layer made of a semiconductor material interposed between two opposite doping layers. When a bias is applied to both ends of the two doping layers, holes and electrons are injected into the active layer and recombined in the active layer, thereby generating light. The light generated by the active layer is discharged in all direction or a specific direction and discharged outside the LED through an exposed surface.

The light-emitting chip 110 may be a flip chip, but is not limited thereto and may be a vertical chip or a lateral chip. In the drawings, the light-emitting chip 110 has been illustrated as being a lateral chip, for convenience sake. The size of the light-emitting chip 110 may be 600 um in width and 700 um in height, but is not limited thereto. The light-emitting chip 110 may emit deep UV rays having a wavelength of 190~400 nm. More specifically, the light-emitting chip 110 may emit deep UV rays having a wavelength of 250~280 nm. In this case, the deep UV rays emitted by the light-emitting chip 110 have the best sterilizing power. Although not shown in FIG. 1, the light-emitting chip 110 may include a board and a light-emitting structure in which a first conductive type semiconductor layer, an active layer, and a second conductive type semiconductor layer are sequentially disposed on the board. The board of the light-emitting chip 110 may have a light transmission characteristic capable of transmitting light. The board may be at least one of an insulating board made of sapphire (Al2O3) or spinel (MgAl2O4) and a semiconductor board made of SiC, Si, GaAs, GaN, InP, or Ge.

The light-emitting chip 110 is disposed in the sub-mount 120. The sub-mount 120 transfers heat, generated by the light-emitting chip 110, to the lead frame 200 by discharging the heat. Furthermore, one end of the wire 130 which electrically connects the light-emitting device 100 and the lead frame 200 is connected to the sub-mount 120. The sub-mount 120 may be made of aluminum nitride (AlN) or silicon carbide (SiC) having high thermal conductivity, but is not limited thereto. The light-emitting chip 110 and the sub-mount 120 may be coupled by a solder bumper.

Figure 2:
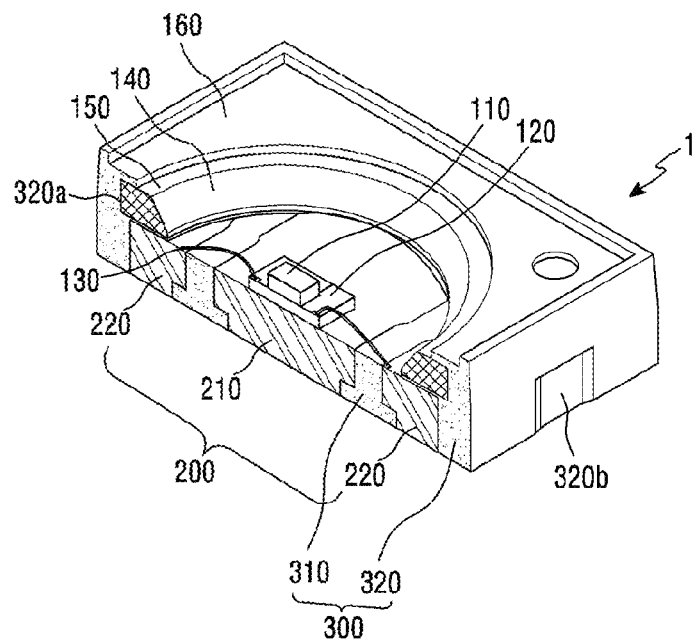
FIG. 2 is a cross-sectional perspective view of the light-emitting device package according to an embodiment.
Figure 3:
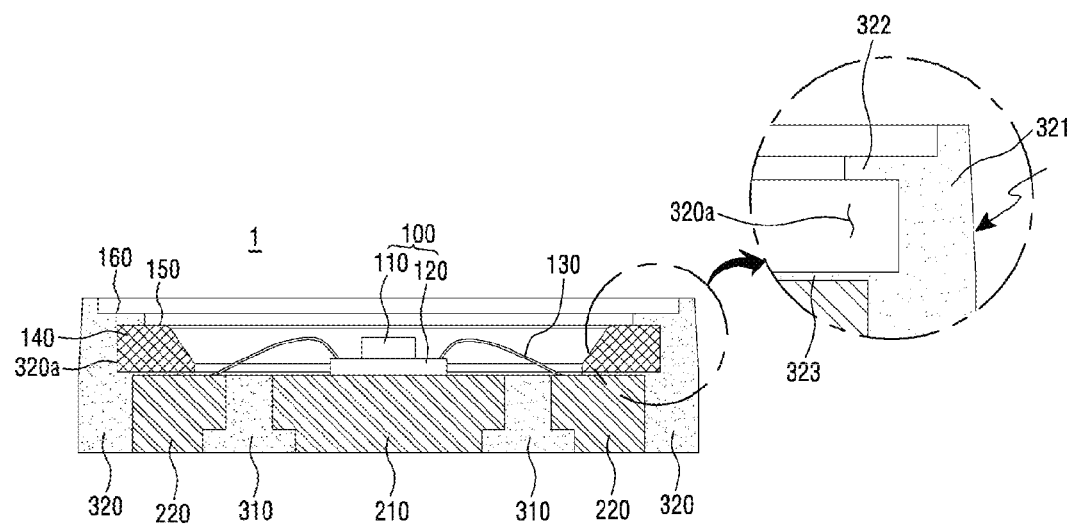
FIG. 3 is a cross-sectional view of the light-emitting device package according to an embodiment.

FIG. 2 is a cross-sectional perspective view of the light-emitting device package according to an embodiment, and FIG. 3 is a cross-sectional view of the light-emitting device package according to an embodiment.

Referring to FIGS. 2 and 3, the reflector layer 140 of the light-emitting device package 1 according to an embodiment reflects light emitted by the light-emitting device 100. The reflector layer 140 is configured to surround the surroundings of the light-emitting device 100 and disposed on the lead frame 200. The reflector layer 140 may be made of metal. Specifically, the reflector layer 140 of the light-emitting device package 1 according to an embodiment may be made of pure aluminum. Accordingly, the reflector layer 140 may have high light reflectivity, excellent thermal diffusion, and corrosion resistance against oxygen and hydrogen sulfide gas. The inside of the reflector layer 140 may have a concave circle, but the shape of the reflector layer 140 is not necessarily limited to a circle.

A lens guide unit 150 in which an optical lens (not shown) may be disposed may be formed on top of the reflector layer 140. Furthermore, a plate guide unit 160 in which a plate (not shown) may be disposed may be disposed on the reflector layer 140. The lens guide unit 150 may be formed by the top surface of the reflector layer 140 and a wall portion 321 formed by one end of a second resin package 320 to be described later. Furthermore, the plate guide unit 160 may be formed by a plane portion formed on the top surface of the second resin package 320 and one side of the wall portion upward protruded from the top surface of the second resin package 320. This is described later. A sealing resin agent may be filled between the lens (not shown) or the plate (not shown) and the reflector layer 140. Silicon resin may be used as the sealing resin agent. The lens (not shown) or the plate (not shown) according to an embodiment may be a glass lens or a glass plate including a fluorescent material. Accordingly, a light velocity maintenance rate can be improved because a fluorescent material is not dispersed in the lens (not shown) or the plate (not shown) or a sealant including a fluorescent material is not used, but the lens (not shown) or the plate (not shown) includes a fluorescent material. That is, reliability of the light-emitting device package 1 can be improved.

The lead frame 200 is placed under the light-emitting device 100, and the light-emitting device 100 is mounted on the lead frame 200. The lead frame 200 may include a first frame 210 on which the light-emitting device 100 is directly mounted and a second frame 220 electrically connected to the light-emitting device 100 through the wires 130. An open portion into which the first resin package 310 of the resin package 300 to be described later is inserted may be formed between the first frame 210 and the second frame 220. The lead frame 200 may be made of a copper alloy including a copper (Cu) component. Accordingly, the lead frame 200 may function as a heat dissipater because it has thermal conductivity that is 2 to 3 times that of the sub-mount 120 made of aluminum nitride (AlN). Accordingly, the light-emitting device package 1 according to an embodiment is advantageous in terms of a cost because a separate heat dissipater is not necessary and copper (Cu) is used.

If the thickness of the lead frame 200 is thick, the lead frame 200 may function as a high-capacity heat dissipater. If the thickness of the lead frame 200 is increased, a cost for the lead frame 200 may be increased, but the cost can be reduced compared to the addition of a separate heat dissipater. Furthermore, as the lead frame 200 made of copper (Cu) becomes thick, heat diffusion becomes better and an influence is reduced. If the thickness of the lead frame 200 is increased, a friction force with the resin package 300 is increased, and the penetration of an alien substance or water from the bottom to the light-emitting device package 1 becomes difficult. Furthermore, if the thickness of the lead frame 200 is increased, resistance to a deformation attributable to external stress is also increased.

Specifically, the thickness of the lead frame 200 made of a copper (Cu) component may be 0.5 mm to 1.5 mm. If the thickness of the lead frame 200 is smaller than 0.5 mm, heat diffusion and heat discharge performance are poor. If the thickness of the lead frame 200 is greater than 1.5 mm, an increase of a manufacturing cost attributable to an increase in the thickness of the lead frame 200 compared to an increase of heat diffusion and heat discharge performance may become a problem. Furthermore, if the thickness of the lead frame 200 made of a copper (Cu) component is less than 0.5 mm, resistance to the deformation of the light-emitting device package 1 attributable to external stress becomes smaller than a limit. If the thickness of the lead frame 200 is more than 1.5 mm, an increase of a manufacturing cost may become problematic.

In summary, if the thickness of the lead frame 200 made of a copper (Cu) component is smaller than 0.5 mm, any one of heat diffusion, heat discharge, resistance to a deformation, and water penetration prevention performance is lower than a limit. As the thickness of the lead frame 200 becomes thick, such characteristics are improved. However, if the thickness of the lead frame 200 made of a copper (Cu) component is more than 1.5 mm, an increase of a manufacturing cost may become a problem compared to the improvement of the aforementioned characteristics in the manufacture of the light-emitting device package 1.

The light-emitting device 100 may be directly mounted on the first frame 210. Although not shown in the drawings, a die bonding paste (not shown) to which the light-emitting device 100 may be formed on top surface of the first frame 210. The light-emitting device 100 may be mounted on the first frame 210 using a die bonding paste. The die bonding paste may include epoxy resin or silicon resin having light stability.

The second frame 220 may be electrically connected to the light-emitting device 100 through the wires 130.

The resin package 300 of the light-emitting device package 1 according to an embodiment may include a first resin package 310 inserted into the first frame 210 and second frame 220 of the lead frame 200 and the second resin package 320 configured to surround the light-emitting device 100 and the reflector layer 140 and to have a concave portion in a central part.

The first resin package 310 may be filled between the first frame 210 and the second frame 220. The second resin package 320 may be formed to surround the outside the lead frame 200 and the outside and part of the upper side of the reflector layer 140. The first resin package 310 and the second resin package 320 may be formed by molding or transfer-molding thermoplastic resin or thermosetting resin on the lead frame 200. The first resin package 310 and the second resin package 320 may have various shapes according to the design of a mold.

Thermoplastic resin or thermosetting resin used in the first resin package 310 and the second resin package 320 may include black resin having a strong weather-proof property. For example, black aromatic nylon may be used, but the present invention is not limited thereto. The resin package 300 may be discolored or deteriorated because it is exposed to heat and light from the light-emitting device 100 for a long time. The light-emitting device package 1 according to an embodiment can prevent the deterioration of UV rays having a short wavelength and the discoloration because black resin having a good weather-proof property is used. Accordingly, if the light-emitting device 100 is a white LED, black resin does not need to be used, and white resin may be used. White resin is advantageous in terms of light efficiency because it has higher optical transmittance than black resin.

As shown in FIGS. 1 to 3, the second resin package 320 may include a groove portion 320a into which part of the reflector layer 140 can be inserted and fixed and a concave portion 320b to which the outskirt frame 410 of a lead frame prototype 400 to be described later with reference to FIGS. 7 and 8 can be coupled.

Specifically, the second resin package 320 may include the wall portion 321 vertically formed outside the lead frame 200 and the reflector layer 140. A protrusion 322 horizontally protruded from the wall portion 321 to the light-emitting device 100 may be formed in the second resin package 320. The protrusion 322 may be formed to cover at least part of the top surface of the reflector layer 140. The groove portion 320a may be formed to be surrounded by the wall portion 321 and protrusion 322 of the second resin package 320 and the top surface of the lead frame 200. Part of the second resin package 320 may be inserted between the reflector layer 140 and the lead frame 200. Specifically, the insertion portion 323 of the second resin package 320 may be disposed between the bottom surface of the reflector layer 140 and the top surface of the lead frame 200. The thickness of the insertion portion 323 may be relatively smaller than the thickness of the reflector layer 140 and the lead frame 320.

The reflector layer 140 is disposed on the lead frame 200. In a prior art, the reflector layer 140 is bonded to the top of the lead frame 200 using adhesives. If such adhesives are used, the residues of the adhesives may contaminate an electrode or the wires. In contrast, in the light-emitting device package 1 according to an embodiment, the groove portion 320a is formed in the second resin package 320. Furthermore, part of the reflector layer 140, for example, the outermost outskirt part of the reflector layer 140 is inserted into the groove portion 320a of the second resin package 320 and fixed thereto. Accordingly, a contamination attributable to the use of adhesives can be prevented and a cost can be reduced because the reflector layer 140 is fixed to the top of the lead frame 200 without using adhesives.

Furthermore, the reflector layer 140 may include the lens guide unit 150 and the plate guide unit 160.

The top surface of the reflector layer 140 includes a portion which is upward open and which is not covered by the protrusion 322 protruded from the wall portion 321. The lens guide unit 150 on which a lens may be mounted may be formed by the open portion and the end of the protrusion 322. Furthermore, the top surface of the wall portion 321 and the top surface of the protrusion 322 may be configured to have a step over the reflector layer 140. The plate guide unit 160 on which a plate (not shown) may be mounted may be formed by the step.

The reflector layer 140 may be made of metal having high strength. Accordingly, reflection with high precision is possible when the reflector layer 140 is stably fixed on the lead frame 200 because the reflector layer 140 is rarely deformed. The concave portion 320b is described later.

Figure 4:
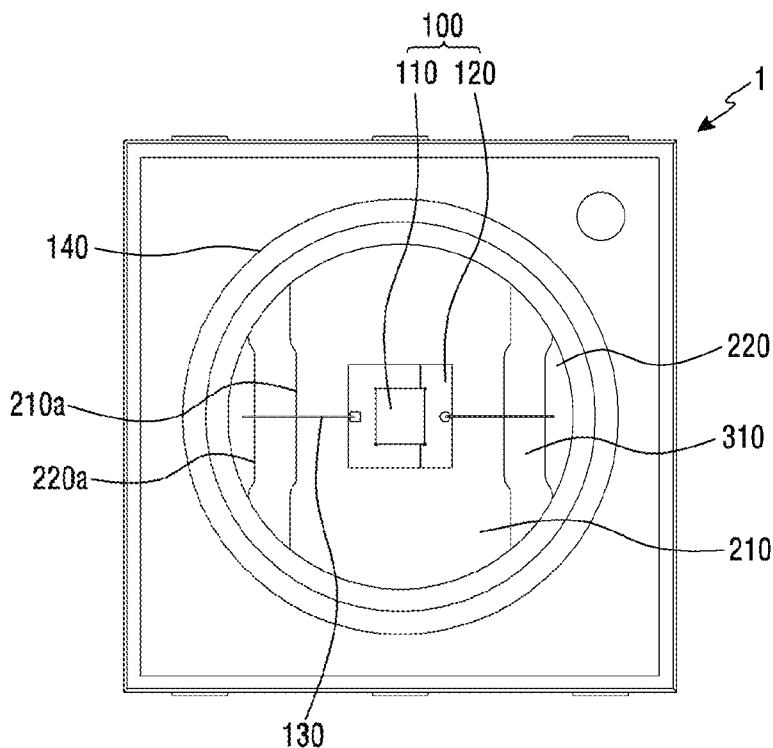
FIG. 4 is a plan view of the light-emitting device package according to an embodiment.
Figure 5:
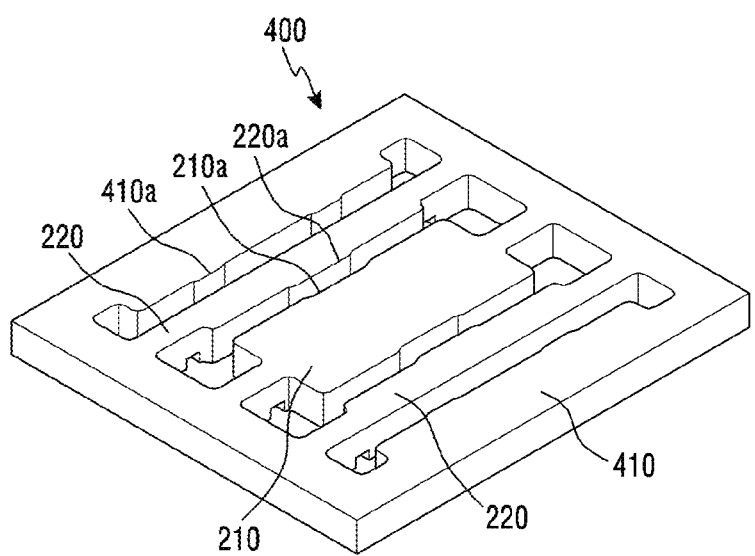
FIG. 5 is a perspective view of a lead frame.

FIG. 4 is a plan view of the light-emitting device package according to an embodiment, and FIG. 5 is a perspective view of the lead frame.

Referring to FIGS. 1 to 5, the reflector layer 140 may be formed over the first frame 210 and the second frame 220, and the open portion may be formed within the reflector layer 140. The light-emitting device 100 may be disposed in the open portion of the reflector layer 140, and the open portion may be filled with resin.

As shown in FIGS. 4 and 5, part of the first frame 210 and the second frame 220 is bent. Specifically, the first frame 210 may include a concave portion 210a concaved toward the second frame 220. The second frame 220 may include a convex portion 220a which is convex toward the first frame 210 in accordance with the concave portion 210a of the first frame 210. If the first frame 210 and the second frame 220 have a bent shape, a contact surface between the lead frame 200 and the first resin package 310 disposed between the first frame 210 and the second frame 220. Accordingly, there is an advantage in that an adhesion property between the lead frame 200 and the resin package 300 is increased because a contact surface between the lead frame 200 and the first resin package 310 is increased.

Furthermore, as shown in FIGS. 2 and 3, the lead frame 200 of the light-emitting device package 1 has a high degree of a shape because it is a thick copper frame. Accordingly, a step may be formed in the lead frame 200, and the open portion also has a step. Accordingly, a contact surface between the first frame 210 and the second frame 220 and the first resin package 310 can be increased because the first resin package 310 is filled depending on the shape of the open portion between the first frame 210 and the second frame 220. As a result, an adhesion property between the lead frame 200 and the first resin package 310 can be increased. Furthermore, since the lead frame 200 and the first resin package 310 are configured to have the step and coupled, performance for preventing the penetration of water or an alien substance from the bottom of the lead frame 200 can be increased.

Figure 6:
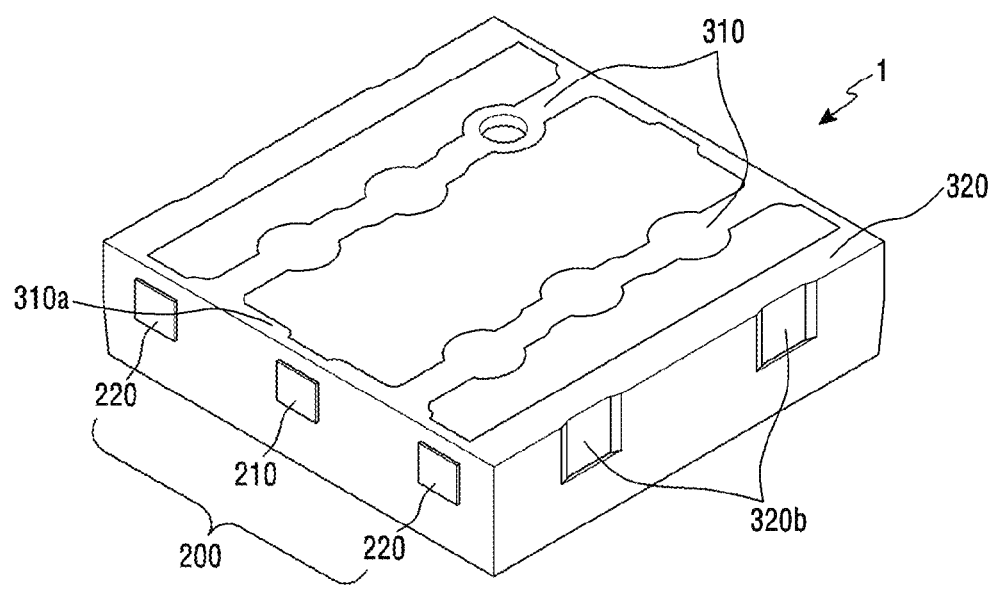
FIG. 6 is a bottom perspective view of the light-emitting device package according to an embodiment.

FIG. 6 is a bottom perspective view of the light-emitting device package according to an embodiment.

Referring to FIGS. 1 to 6, the first resin package 310 is disposed between the first frame 210 and second frame 220 of the lead frame 200. Both ends 310a of the first resin package 310 in the length direction of the first resin package 310 may be extended toward the first frame 210 in the width direction thereof, and part of both ends of the first frame 210 in the length direction of the first frame 210 may be buried by the first resin package 310. Accordingly, since a gap between a terminal protruded outside the first frame 210 and the first resin package 310 is removed, an alien substance which may be generated when the light-emitting device 100 is mounted on the first frame 210 can be prevented from penetrating the light-emitting device package 1 and contaminating the wire or an electrode.

Portions that belong to the first frame 210 and the second frame 220 and that are exposed outside the light-emitting device package 1 may function as the terminals of the light-emitting device package 1. Furthermore, the portions may also function as thermal calculators (TC).

Figure 7:
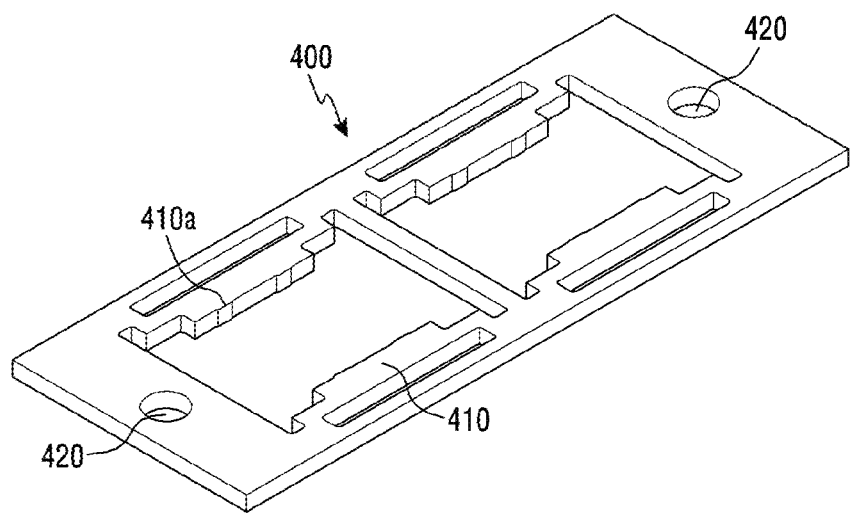
FIG. 7 is a perspective view of a lead frame prototype from which the lead frame has been removed according to an embodiment.

FIG. 7 is a perspective view of the lead frame prototype from which the lead frame has been removed according to an embodiment.

Referring to FIGS. 5 to 7, the lead frame prototype 400 may include the first frame 210, the second frame 220, and the outskirt frame 410. An open portion may be formed between the first frame 210 and the outskirt frame 410 and between the second frame 220 and the outskirt frame 410. The open portions may be filled with resin.

As shown in FIGS. 1 to 7, the concave portion 320b may be formed at the upper part of the second resin package 320 on the outside thereof. The lead frame prototype 400 may include a convex portion 410a formed in the outskirt frame 410 in accordance with the concave portion 320b. Accordingly, when the light-emitting device package 1 is coupled to the lead frame prototype 400, the convex portion 410a is inserted into the concave portion 320b and engaged with an engaging jaw on the upper part of the concave portion 320b. Accordingly, a downward movement of the light-emitting device package 1 from the lead frame prototype 400 is restricted. The light-emitting device package 1 may be separated only upward from the lead frame prototype 400. Accordingly, the light-emitting device package 1 can be easily kept and carried.

Furthermore, a friction force between the lead frame prototype 400 and the second resin package 320 outside the light-emitting device package 1 is great because the lead frame prototype 400 is thick. Accordingly, the light-emitting device package 1 can be fixed to the lead frame prototype 400 without using adhesives. Accordingly, an alien substance is not generated in the light-emitting device package 1 according to an embodiment because the light-emitting device package 1 is fixed to the lead frame prototype 400 without using adhesives.

Figure 8:
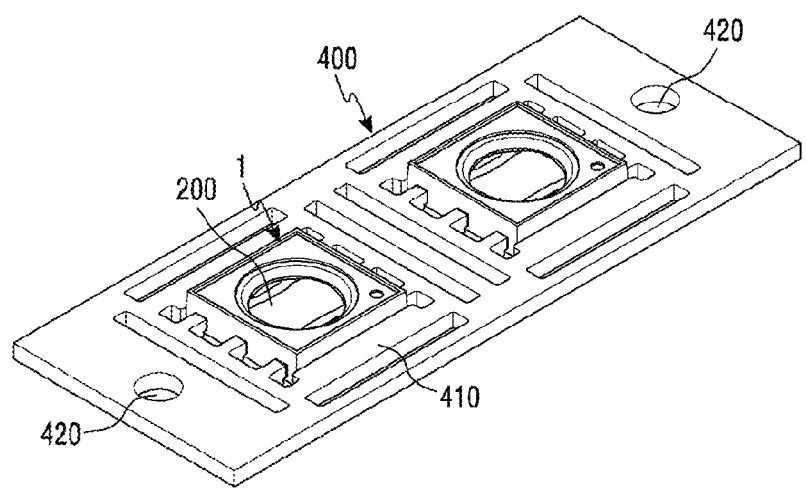
FIG. 8 is a perspective view of the state in which the light-emitting device package in which a light-emitting device has not been mounted on the lead frame prototype has been combined.

FIG. 8 is a perspective view of the state in which the light-emitting device package in which the light-emitting device has not been mounted on the lead frame prototype has been combined.

Referring to FIGS. 1 and 8, the light-emitting device package 1 is disposed on the lead frame 200 of the lead frame prototype 400. When the resin package 300 is formed by molding resin on the lead frame 200, the light-emitting device package 1 is mounted on the lead frame 200.

In this case, the lead frame prototype 400 may include two lead frames 200 so that two light-emitting device packages 1 are mounted.

Figure 9:
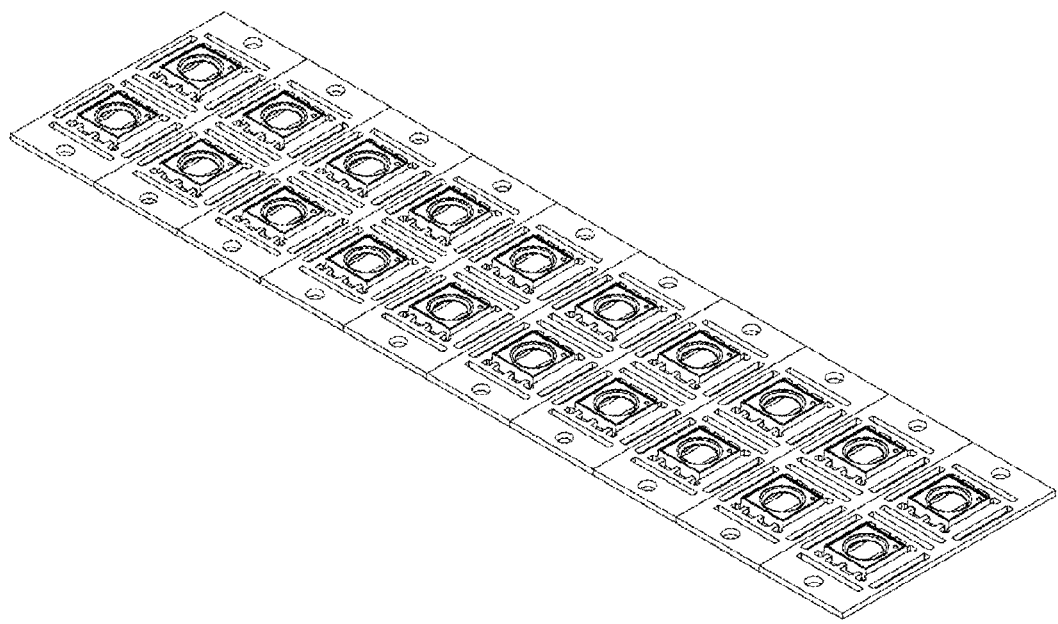
FIG. 9 is a perspective view showing the structure of light-emitting device packages capable of mass production.

FIG. 9 is a perspective view showing the structure of the light-emitting device packages capable of mass production.

Referring to FIG. 9, the light-emitting device package 1 according to an embodiment may be subjected to mass production by a mold in such a way as to extend in two rows. Accordingly, a cost can be reduced because the light-emitting device package 1 can be subjected to mass production through a mold.

Figure 10:
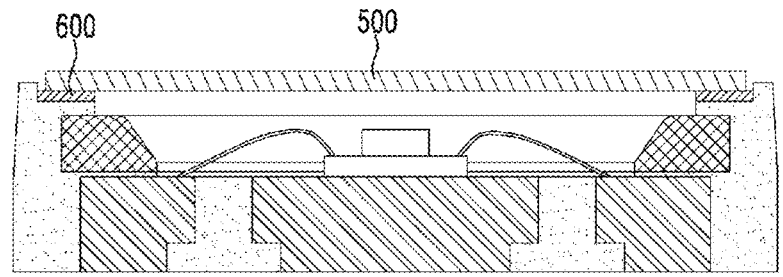
FIG. 10 is a cross-sectional view of a light-emitting device package according to another embodiment.

FIG. 10 is a cross-sectional view of a light-emitting device package according to another embodiment.

The light-emitting device package according to another embodiment shown in FIG. 10 is different from the light-emitting device package 1 shown in FIGS. 1 to 7 in that a plate 500 and an adhesive member 600 are added. The added plate 500 and adhesive member 600 may be applied to other light-emitting device packages without a change in addition to the light-emitting device package 1 shown in FIGS. 1 to 7. Accordingly, it is to be noted that the added plate 500 and adhesive member 600 are not applied to only the light-emitting device package 1 shown in FIGS. 1 to 7.

In order to apply the plate 500 and adhesive member 600 of FIG. 10 to another light-emitting device package in addition to the light-emitting device package 1 of FIGS. 1 to 7, the light-emitting device package according to another embodiment is described with reference to FIG. 11.

Figure 11:
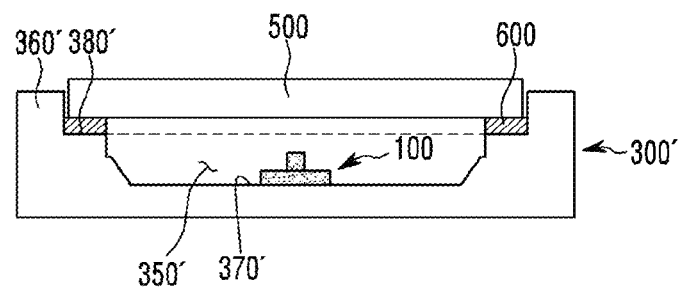
FIG. 11 is a cross-sectional view of a light-emitting device package generalized from the light-emitting device package shown in FIG. 10.

FIG. 11 is a cross-sectional view of a light-emitting device package generalized from the light-emitting device package shown in FIG. 10.

Referring to FIG. 11, the generalized light-emitting device package may include a light-emitting device 100, a package body 300', the plate 500, and the adhesive member 600. In this case, the light-emitting device 100 is the same as the light-emitting device 100 of FIGS. 1 to 4, and a description thereof is omitted.

The light-emitting device 100, the plate 500, and the adhesive member 600 are disposed in the package body 300'.

The package body 300' may include a cavity 350' in which the light-emitting device 100 is disposed. The cavity 350' may be a groove formed in the central part of the top surface 380' of the package body 300'.

The package body 300' may include a plate guide unit 360'.

The plate guide unit 360' may have been upward protruded from part of the top surface 380' of the package body 300' or may have been disposed on part of the top surface 380' of the package body 300'.

The plate guide unit 360' may be disposed to surround the side of the plate 500. In this case, the plate guide unit 360' may surround part of the side of the plate 500.

The plate guide unit 360' may be spaced apart from the plate 500 at a specific interval.

The package body 300' may include a disposition surface 370' in which the light-emitting device 100 is disposed.

The package body 300' may include the lead frame 200, resin package 300, and reflector layer 140 of the light-emitting device package 1 shown in FIGS. 1 to 7.

The plate 500 may be disposed on the light-emitting device 100 and coupled to the package body 300'.

The plate 500 is disposed on the top surface 380' of the package body 300' and guided by the plate guide unit 360'.

The plate 500 may include a top surface, a bottom surface, and a side. Light from the light-emitting device 100 is received through the bottom surface of the plate 500, and light is discharged to the outside through the top surface of the plate 500.

The top surface of the plate 500 may be disposed at the location higher than the top surface of the plate guide unit 360'.

The side of the plate 500 may be surrounded by the plate guide unit 360'. The side of the plate 500 may be spaced apart from the plate guide unit 360' at a specific interval.

The edge of the bottom surface of the plate 500 may be disposed on the top surface 380' of the package body 300'.

The adhesive member 600 may be disposed between the package body 300' and the plate 500 so that the plate 500 is bonded to the package body 300'.

The adhesive member 600 may be disposed between the top surface 380' of the package body 300' and the bottom surface of the plate 500. The bottom surface of the adhesive member 600 may come in contact with the top surface 380' of the package body 300', and the top surface of the adhesive member 600 may come in contact with the bottom surface of the plate 500.

A detailed structure of the adhesive member 600 is described with reference to FIG. 12.

Figure 12:
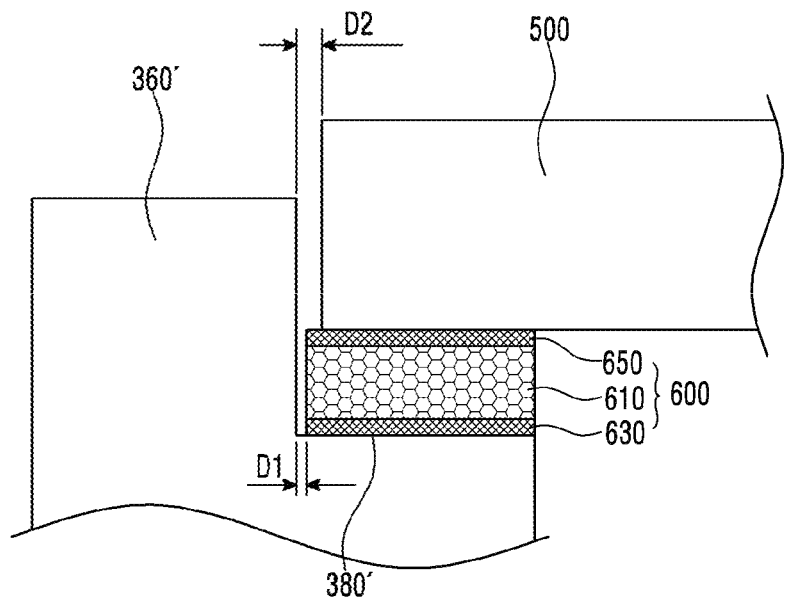
FIG. 12 is an enlarged view of part of the light-emitting device package shown in FIG. 11.

FIG. 12 is an enlarged view of part of the light-emitting device package shown in FIG. 11.

Referring to FIGS. 11 and 12, the adhesive member 600 may include a base layer 610, a first adhesive tape 630, and a second adhesive tape 650.

The material of the base layer 610 is a flexible material and may be rubber, for example. If the base layer 610 is made of a flexible material, in particular, rubber, although the top surface 380' of the package body 300' is not regular, there is an advantage in that the first adhesive tape 630 is pressed and thus the first adhesive tape 630 is well bonded to the top surface 380' of the package body 300' entirely. In this case, rubber generally refers to a polymer substance of a chain shape which has specific elasticity at room temperature or a polymer compound that is the raw material of the polymer substance. Furthermore, the meaning that the top surface 380' is not regular includes that the top surface 380' is not flat or concave-convex parts are formed in part of the top surface 380' due to the characteristics of the material of the package body 300'. In particular, if the top surface 380' of the package body 300' is made of an acrylic material, the top surface 380' made of the acrylic material may not be regular from a viewpoint of the characteristics of the acrylic material.

If the base layer 610 is made of a flexible material, in particular, rubber, although the bottom surface of the plate 500 is not regular, there is an advantage in that the second adhesive tape 650 is pressed and thus the second adhesive tape 650 is entirely bonded to the bottom surface of the plate 500. In this case, the meaning that the bottom surface of the plate 500 is not regular includes that the bottom surface of the plate 500 is not flat or concave-convex parts are formed in part of the bottom surface due to the characteristics of the material of the plate 500.

The first adhesive tape 630 is disposed under the base layer 610. Specifically, the first adhesive tape 630 may be disposed on the bottom surface of the base layer 610.

The first adhesive tape 630 may include a top surface and a bottom surface. The top surface of the first adhesive tape 630 may come in contact with the bottom surface of the base layer 610, and the bottom surface thereof may come in contact with the top surface 380' of the package body 300'.

The material of the first adhesive tape 630 may correspond to that of the package body 300'. For example, if the top surface 380' of the package body 300' is made of an acrylic material, the first adhesive tape 630 may be an acrylic-dedicated tape.

The second adhesive tape 650 is disposed on the base layer 610. Specifically, the second adhesive tape 650 may be disposed on the top surface of the base layer 610.

The second adhesive tape 650 may include a top surface and a bottom surface. The top surface of the second adhesive tape 650 may come in contact with the bottom surface of the plate 500, and the bottom surface thereof may come in contact with the top surface of the base layer 610.

The material of the second adhesive tape 650 may correspond to that of the plate 500. For example, if the plate 500 is made of a glass material, the second adhesive tape 650 may be a glass-dedicated tape.

The thickness of the adhesive member 600 may be 0.15 mm or more to 1.0 mm or less.

If the thickness of the adhesive member 600 is less than 0.15 mm, it is difficult to detach the adhesive member 600 from a protection sheet (not shown). Furthermore, there is a problem in that workability is reduced because it is difficult to attach the adhesive member 600 to the top surface 380' of the package body 300' although the adhesive member 600 is detached from the protection sheet. The protection sheet (not shown) functions to protect the adhesive force of the first and the second adhesive tapes 630 and 650 of the adhesive member 600 before the adhesive member 600 is installed in the package body 300'. Furthermore, there is a problem in that a gap is likely to be generated between the adhesive member 600 and the top surface 380' of the package body 300' because the adhesive member 600 becomes difficult to adhere to concave-convex parts which may be formed in the top surface 380' of the package body 300' without a change. Furthermore, there are problems in that it is difficult to cut the adhesive member 600 even in a process of processing the adhesive member 600 and the yield is reduced because a portion is likely to stick out from the edge portion of the adhesive member 600 although the adhesive member 600 is cut.

Furthermore, there are problems in that if the thickness of the adhesive member 600 is more than 1.0 mm, a material cost is increased and profitability is reduced and the yield is reduced because it is difficult to accurately cut the adhesive member 600 due to a thick thickness.

As described above, the first adhesive tape 630 corresponds to the material of the package body 300', and the second adhesive tape 650 corresponds to the material of the plate 500. Accordingly, in accordance with the adhesive member 600 including the first adhesive tape 630 and the second adhesive tape 650, both the package body 300' and the plate 500 may be bonded stably and tightly if they are different materials.

Furthermore, there are advantages in that the first adhesive tape 630 can be bonded to the top surface 380' of the package body 300' entirely well and the second adhesive tape 650 can bonded to the bottom surface of the plate 500 entirely well by means of the base layer 610 although the top surface 380' of the package body 300' and the bottom surface of the plate 500 are not uniform.

Furthermore, in a prior art, there is a need for a process of curing adhesives using UV rays. In contrast, there is an advantage in that such a curing process is not required if the adhesive member 600 is used. Furthermore, there is an advantage in that all problems which may occur due to curing are not generated.

The adhesive member 600 may be spaced apart from the plate guide unit 360' at a specific interval. Specifically, the adhesive member 600 may be spaced apart from the side of the plate guide unit 360' at a specific interval. If the adhesive member 600 is spaced apart from the plate guide unit 360' at a specific interval, a case where the shape of the adhesive member 600 is extended because the adhesive member 600 is compressed by the plate 500 can be prepared for.

A distance D1 between the adhesive member 600 and the plate guide unit 360' may be smaller than a distance D2 between the plate 500 and the plate guide unit 360'. The distance D1 is a marginal space necessary when the adhesive member 600 is mounted on the top surface 380' of the package body 300'. The distance D2 is a marginal space necessary when the plate 500 is mounted on the package body 300'. The distances D1 and D2 may provide a space into which an extended portion of the adhesive member 600 can be inserted when the adhesive member 600 is pressed by the plate 500 and thus the adhesive member 600 is extended by corresponding pressure.

Figure 13:
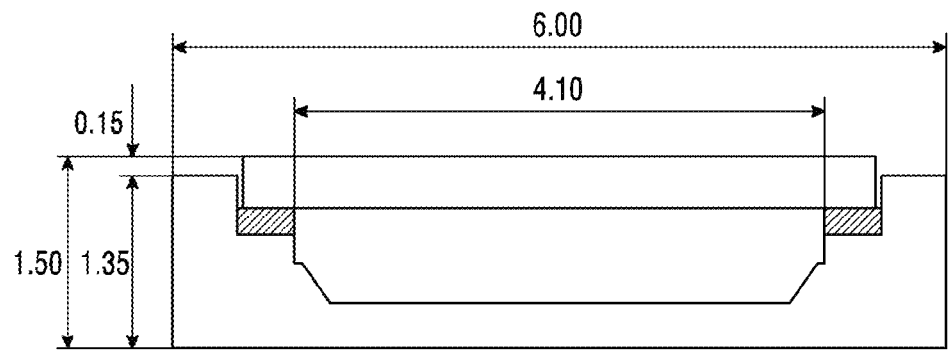
FIGS. 13 to 16 are design diagrams including the actual dimensions of the light-emitting device package shown in FIGS. 11 and 12.
Figure 14:
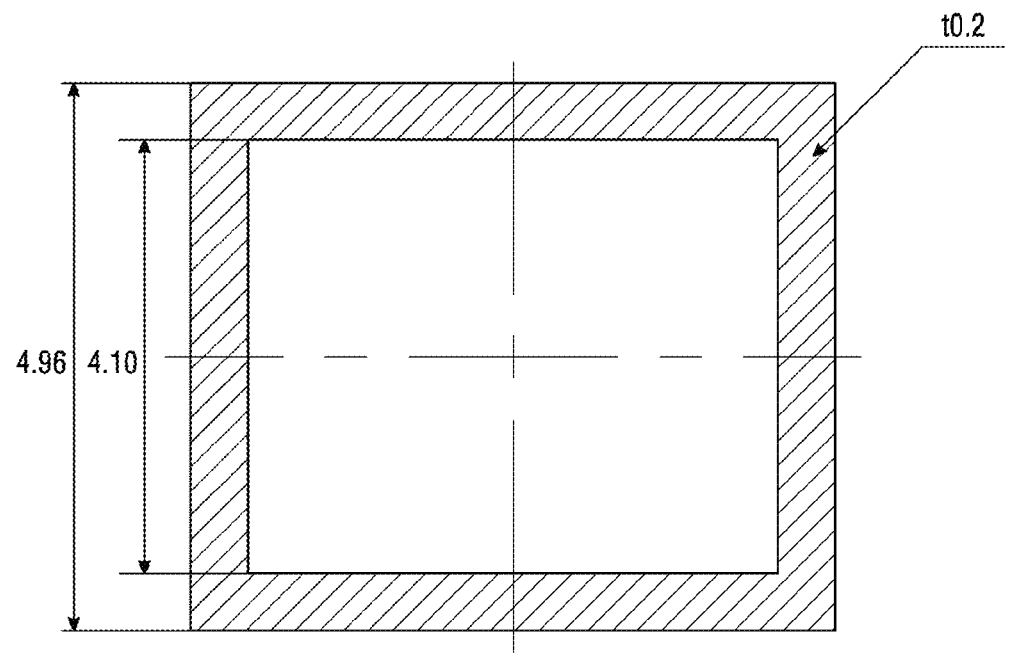
Figure 15:
Figure 16:
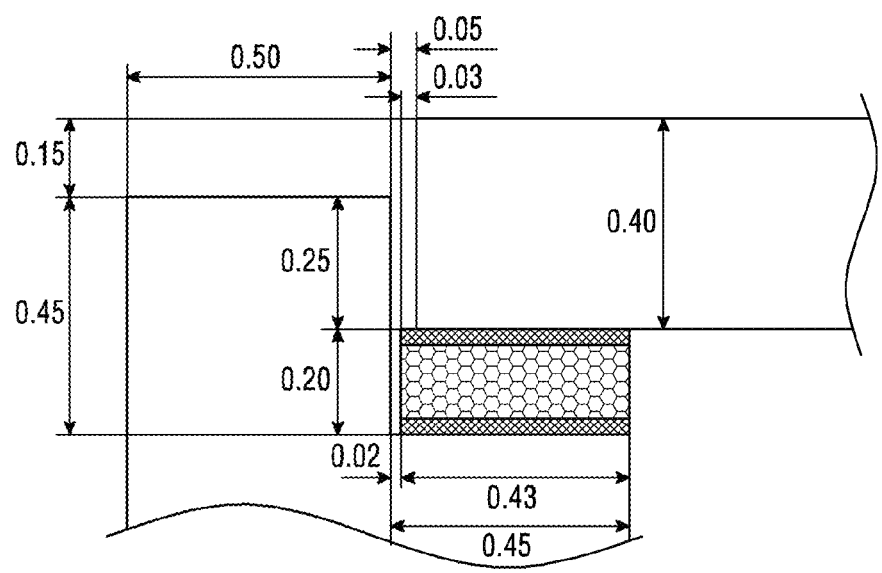

FIGS. 13 to 16 are design diagrams including the actual dimensions of the light-emitting device package shown in FIGS. 11 and 12. Specifically, FIG. 13 is a design diagram of the light-emitting device package shown in FIG. 11, FIG. 14 is a plan view of the adhesive member 600 shown in FIG. 11, FIG. 15 is a cross-sectional view of the adhesive member 600 shown in FIG. 12, and FIG. 16 is a design diagram of the light-emitting device package shown in FIG. 12.

Figure 17:
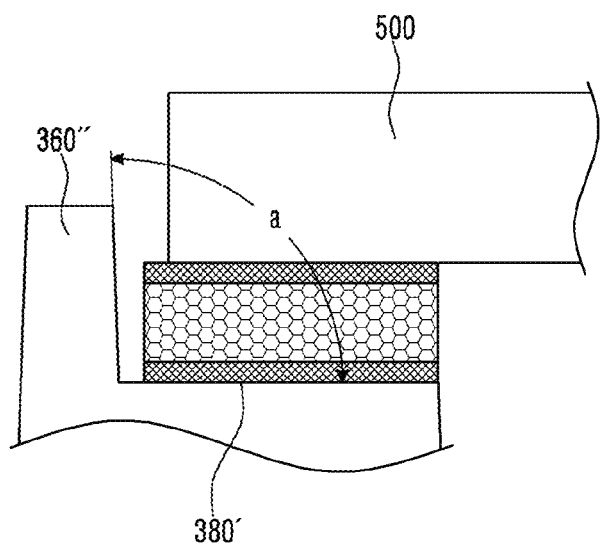
FIG. 17 shows a modified example of the light-emitting device package shown in FIG. 12.
Figure 18:
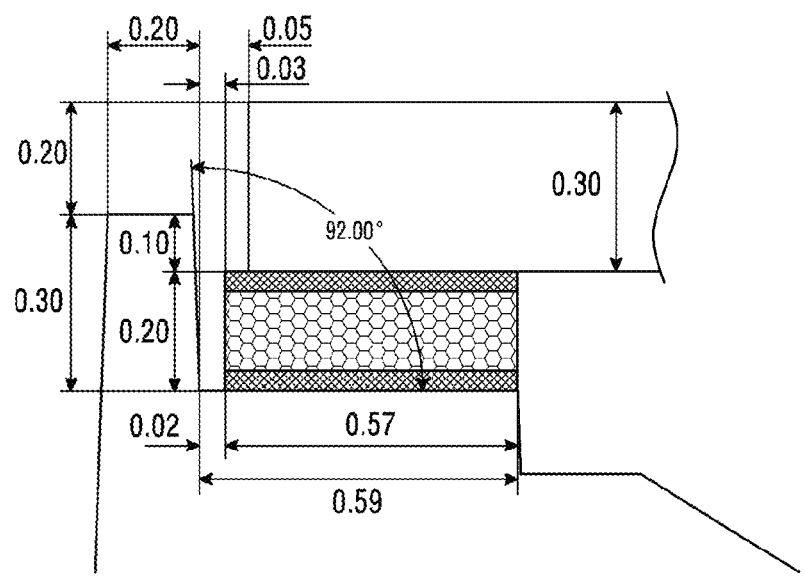
FIG. 18 is a design diagram of the light-emitting device package shown in FIG. 17.

FIG. 17 shows a modified example of the light-emitting device package shown in FIG. 12, and FIG. 18 is a design diagram of the light-emitting device package shown in FIG. 17.

Referring to FIGS. 17 and 18, a plate guide unit 360" is different from the plate guide unit 360' of FIG. 12.

The plate guide unit 360' of FIG. 17 has a constant width from bottom to top, whereas the plate guide unit 360" has a narrower width from bottom to top.

An angle "a" between the side of the plate guide unit 360" and the top surface 380' may be an obtuse angle. If the angle "a" is an obtuse angle, there are advantages in that a worker can easily insert the adhesive member 600 into the package body 300' and can easily separate a completed package body 300' from the mold of the package body 300' when fabricating the package body 300'.

Figure 19:
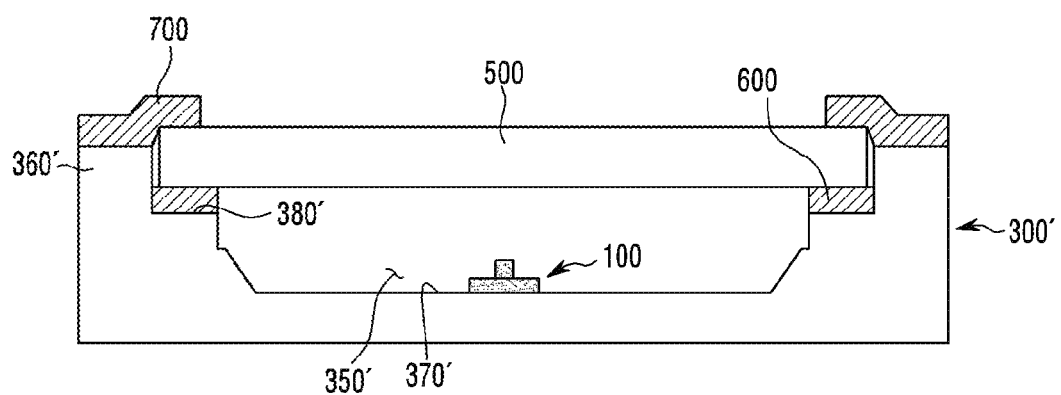
FIG. 19 is a cross-sectional view of a light-emitting device package according to yet another embodiment.

FIG. 19 is a cross-sectional view of a light-emitting device package according to yet another embodiment.

The light-emitting device package according to yet another embodiment shown in FIG. 19 further includes an adhesive member 700 added to the light-emitting device package shown in FIG. 11. Hereinafter, in order to avoid confusion between the added adhesive member 700 and the adhesive member 600, the adhesive member 600 is defined as an internal adhesive member and the adhesive member 700 is defined as an external adhesive member.

In the light-emitting device package according to yet another embodiment shown in FIG. 19, the remaining elements other than the external adhesive member 700 are the same as those of the light-emitting device package shown in FIG. 11, and a description thereof is omitted.

The external adhesive member 700 couples the package body 300' and the plate 500 stably and tightly. One part of the external adhesive member 700 is bonded to the package body 300', and the other part thereof is bonded to the plate 500. In accordance with the external adhesive member 700, the plate 500 can be fixed to the package body 300' more stably compared to a case where only the internal adhesive member 600 is used.

The external adhesive member 700 is disposed on the package body 300' and the plate 500. Specifically, the external adhesive member 700 is disposed on the plate guide unit 360' of the package body 300' and on the edge portion of the top surface of the plate 500.

A detailed structure of the external adhesive member 700 is described with reference to FIG. 20.

Figure 20:
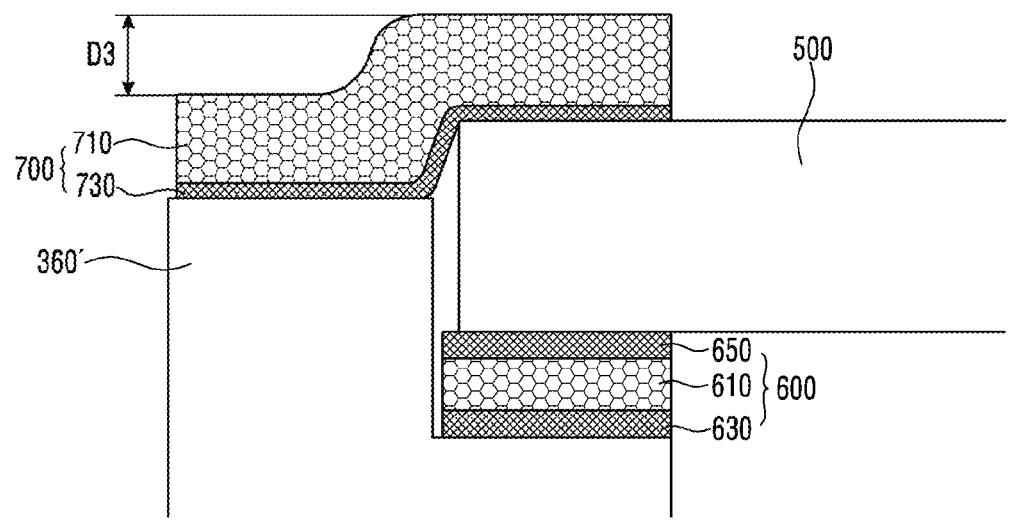
FIG. 20 is an enlarged view of part of the light-emitting device package shown in FIG. 19.

FIG. 20 is an enlarged view of part of the light-emitting device package shown in FIG. 19.

Referring to FIG. 20, the external adhesive member 700 may include a base layer 710 and an adhesive tape 730.

The material of the base layer 710 is a flexible material and may be rubber, for example. If the base layer 710 is made of a flexible material, in particular, rubber, there are advantages in that the adhesive tape 730 can be pressed and thus the adhesive tape 730 can be bonded to the top surface of the plate guide unit 360' entirely well although the top surface of the plate guide unit 360' of the package body 300' is not uniform and the adhesive tape 730 can be pressed and thus the adhesive tape 730 can be bonded to the top surface of the plate 500 entirely well although the top surface of the plate 500 is not uniform. The meaning that the top surface of the plate guide unit 360' and the top surface of the plate 500 are not uniform includes that the top surface of the plate guide unit 360' or the top surface of the plate 500 is not flat or concave-convex parts are formed in part of the top surface of the plate guide unit 360' or the top surface of the plate 500 due to the characteristics of the material of the package body 300'. In particular, if the package body 300' is made of an acrylic material, the top surface of the plate guide unit 360' made of the acrylic material may not be uniform in view of the characteristics of the acrylic material.

Furthermore, if the base layer 710 is made of a flexible material, in particular, rubber, the shape of the base layer 710 can be flexibly changed although there is a specific step D3 between the top surface of the plate guide unit 360' and the top surface of the plate 500. Accordingly, the adhesive tape 730 can be stably bonded to the top surface of the plate guide unit 360' and the top surface of the plate 500.

The adhesive tape 730 is disposed under the base layer 710. Specifically, the adhesive tape 730 may be disposed on the bottom surface of the base layer 710.

The adhesive tape 730 may include a top surface and a bottom surface. The top surface of the adhesive tape 730 may come in contact with the bottom surface of the base layer 710, and the bottom surface thereof may come in contact with the top surface of the plate 500 and the top surface of the plate guide unit 360' of the package body 300'.

Part of the bottom surface of the adhesive tape 730 may not come in contact with the top surface of the plate guide unit 360' and the top surface of the plate 500. This may be generated because the plate guide unit 360' is spaced apart from the plate 500.

The material of the adhesive tape 730 may correspond to that of the plate guide unit 360' of the package body 300' or may correspond to that of the plate 500. For example, if the top surface of the plate guide unit 360' of the package body 300' is made of an acrylic material, the adhesive tape 730 may be an acrylic-dedicated tape. In some embodiments, if the material of the plate 500 is a glass material, the adhesive tape 730 may be a glass-dedicated tape.

In some embodiments, the material of the adhesive tape 730 may not correspond to the material of the plate guide unit 360' or the material of the plate 500, but may be a material which may be well bonded to both the plate guide unit 360' and the plate 500.

The internal adhesive member 600 of the light-emitting device package shown in FIG. 19 may include conventional adhesives. In some embodiments, the light-emitting device package shown in FIG. 19 may not include the internal adhesive member 600. Accordingly, it is to be noted that the internal adhesive member 600 may not be an essential element in the light-emitting device package shown in FIG. 19.

Figure 21:
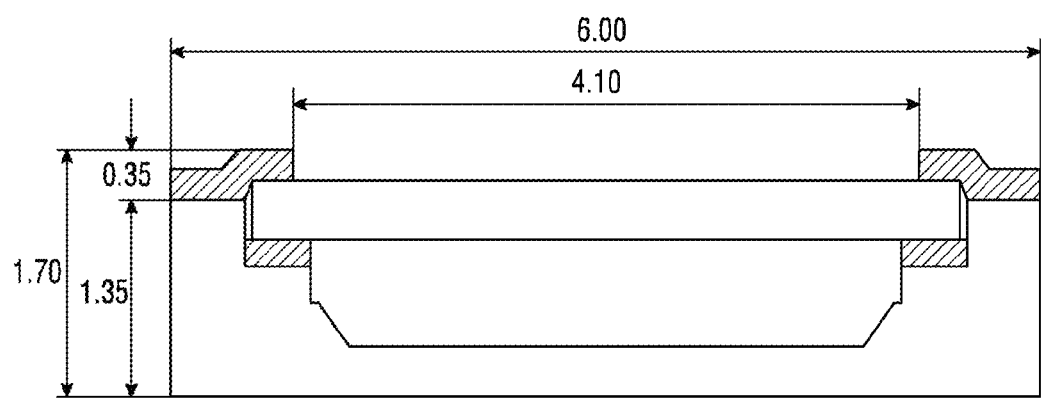
FIGS. 21 to 24 are design diagrams including the actual dimensions of the light-emitting device package shown in FIGS. 19 and 20.
Figure 22:
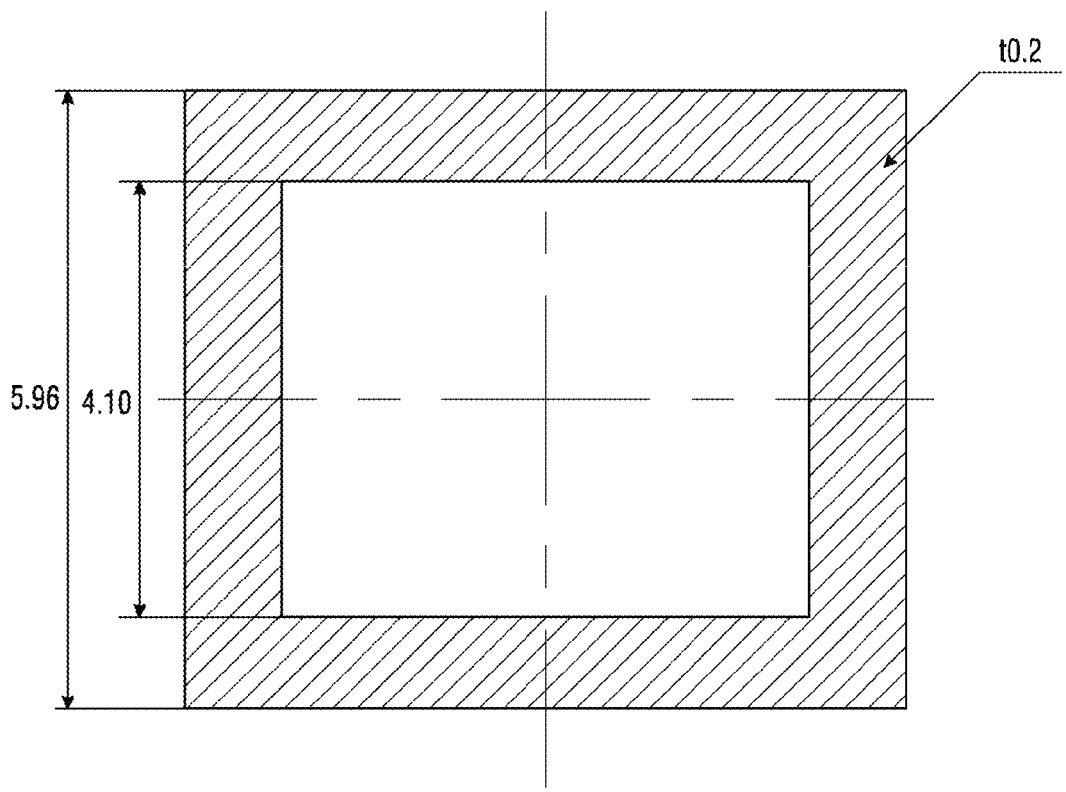
Figure 23:
Figure 24:
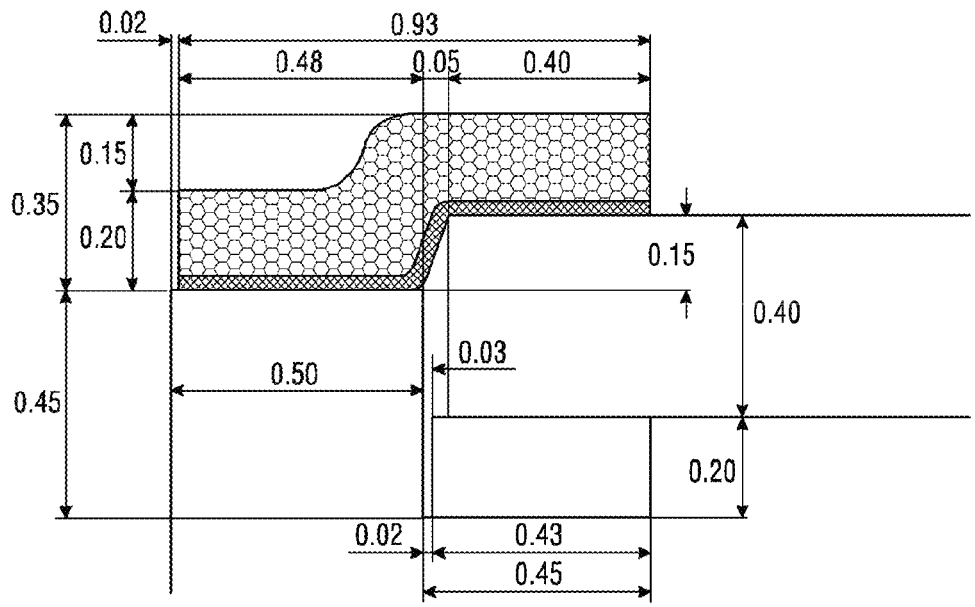

FIGS. 21 to 24 are design diagrams including the actual dimensions of the light-emitting device package shown in FIGS. 19 and 20. Specifically, FIG. 21 is a design diagram of the light-emitting device package shown in FIG. 19, FIG. 22 is a plan view of the external adhesive member 700 shown in FIG. 19, FIG. 23 is a cross-sectional view of the external adhesive member 700 shown in FIG. 19, and FIG. 24 is a design diagram of the light-emitting device package shown in FIG. 20.

If the light-emitting chip of the light-emitting device package according to an embodiment of the present invention is an LED emitting a visible ray, the light-emitting device package according to an embodiment of the present invention may be used in various indoor and outdoor liquid display devices and light devices, such as electronic display boards and street lights.

If the light-emitting chip of the light-emitting device package according to an embodiment of the present invention is a DUV LED emitting deep UV rays, the light-emitting device package according to an embodiment of the present invention may be used in humidifiers and water purifiers for sterilization and purification.

Figure 25:
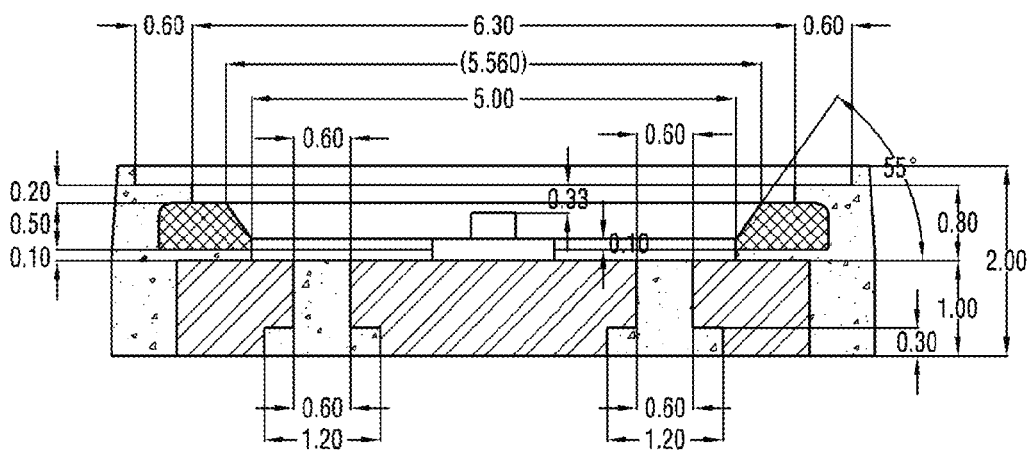
FIG. 25 is a design diagram including the numerical values of the light-emitting device package shown in FIG. 3.

FIG. 25 is a design diagram including the numerical values of the light-emitting device package shown in FIG. 3.

The light-emitting device package shown in FIGS. 1 to 5 includes the reflector layer 140. The reflector layer 140 is made of metal, such as aluminum. If the reflector layer 140 is made of metal, such as aluminum, it can easily reflect deep UV rays emitted by the light-emitting device 100. In this case, a specific problem may be generated due to the reflector layer 140. This is described in detail below.

When reflecting light from the light-emitting device 100, the reflector layer 140 performs multi-reflection (so-called "diffusion reflection" or "diffused reflection") on the light while diffusing the light. An optical loss attributable to multi-reflection may be generated because the reflector layer 140 performs the multi-reflection on incident light. In particular, if the light-emitting device 100 emits light more in the lateral direction than in the upward direction, there may be a problem in that the entire optical output Po of the light-emitting device package is reduced due to the loss.

Furthermore, there is a problem in that optical extraction speed is reduced because the reflector 140 performing multi-reflection does not immediately reflect incident light, but reflects the light after condensing the light.

Furthermore, if the light-emitting device 100 emits light more in the lateral direction than in the upward direction, a backlight spot may be generated in the reflector layer 140.

Furthermore, if the reflector layer 140 performing multi-reflection is used, there is a problem in that it is difficult to control the backlight of light incident on a secondary optical member, such as a lens used on the reflector layer 140.

A light-emitting device package according to further yet another embodiment capable of solving such problems is described with reference to FIG. 26.

Figure 26:
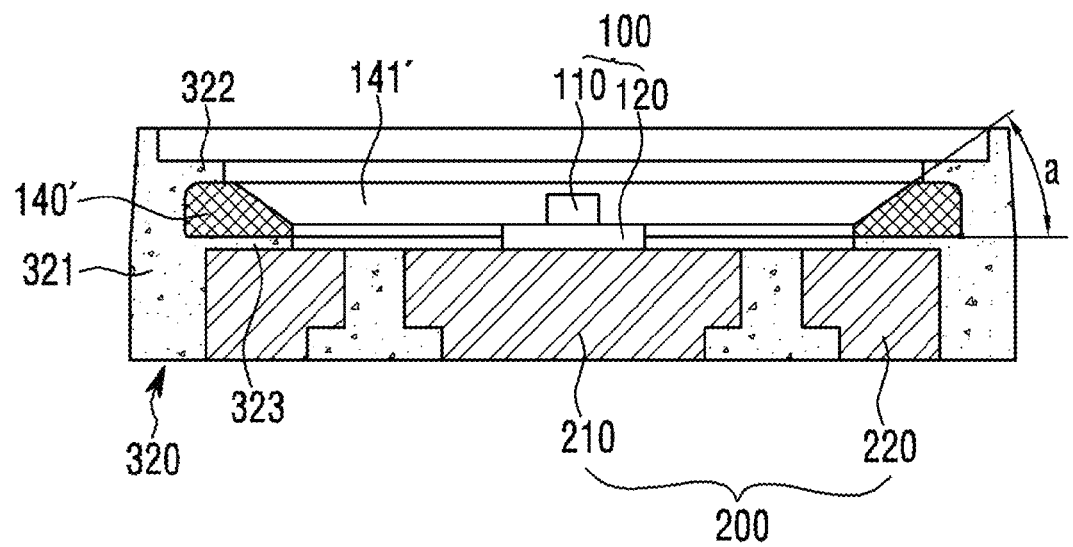
FIG. 26 is a cross-sectional view of a light-emitting device package according to further yet another embodiment.
Figure 27:
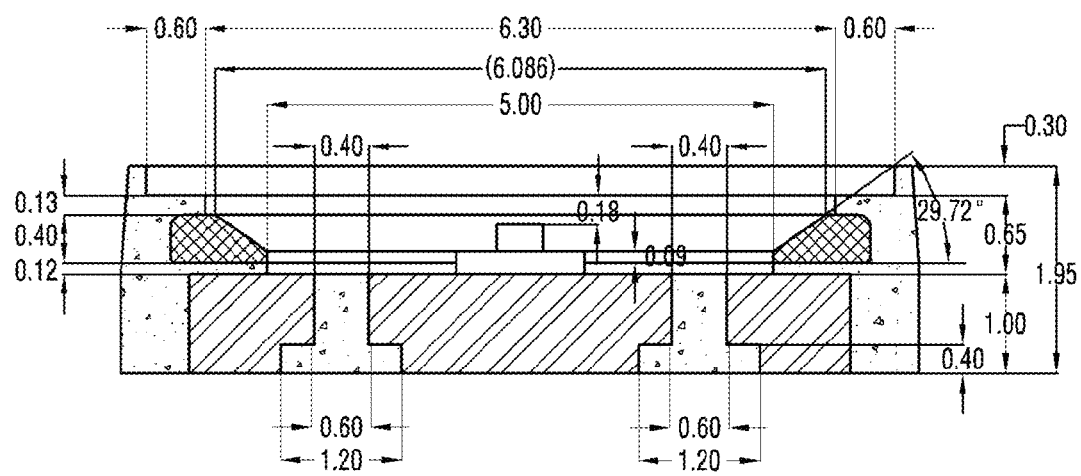
FIG. 27 is a design diagram including the actual dimensions of the light-emitting device package shown in FIG. 26.

FIG. 26 is a cross-sectional view of a light-emitting device package according to further yet another embodiment, and FIG. 27 is a design diagram including the actual dimensions of the light-emitting device package shown in FIG. 26. Numerical values that belong to numerical values shown in FIG. 27 and that are different from numerical values shown in FIG. 25 are expressed thicker than the numerical values shown in FIG. 25.

In the light-emitting device package shown in FIG. 26, the remaining elements other than a reflector layer 140' are the same as those of the light-emitting device package shown in FIGS. 1 to 5, and thus a detailed description thereof is omitted. The reflector layer 140' is described in detail below.

The reflector layer 140' reflects light emitted by the light-emitting device 100. The reflector layer 140' is configured to surround the surroundings of a light-emitting device 100 and disposed on a lead frame 200. The reflector layer 140 may be made of metal.

The inside of the reflector layer 140' may be formed to have a concave circle, but the shape of the reflector layer 140' is not essentially limited to the circle.

The reflector layer 140' may be disposed on the insertion portion 323 of a second resin package 320. The protrusion 322 of the second resin package 320 may be disposed on the reflector layer 140'. Accordingly, the reflector layer 140' may be disposed between the protrusion 322 and insertion portion 323 of the second resin package 320.

The reflector layer 140' may be made of metal or non-metal. The reflector layer 140' may be made of any material.

The reflector layer 140' includes an inclined surface 141'.

The inclined surface 141' of the reflector layer 140' is a mirror surface that performs regular reflection on incident light. Regular reflection is different from diffused reflection (or diffusion reflection). In regular reflection, incident light is reflected without a change. In contrast, in diffused reflection, incident light is subjected to multi-reflection in several directions. If the inclined surface 141' of the reflector layer 140' is a mirror surface, optical output Po and optical extraction speed can be improved. Furthermore, if lateral backlight strength of the light-emitting device 100 is stronger than upward backlight strength thereof, a backlight spot which may appear in the inclined surface 141' can be reduced. Accordingly, the backlight of light incident on a secondary optical member, such as a lens which may be used on the reflector layer 140', can be easily controlled.

The inclined surface 141' of the reflector layer 140' may be a surface inclined from the bottom surface of the reflector layer 140' at a specific angle "a". In this case, the specific angle "a" may be 25 degrees or more to 35 degrees or less. If the specific angle "a" is 25 degrees or more to 35 degrees or less, optical output Po can be improved, and the generation of a backlight spot of a specific shape in the inclined surface 141' can be prevented or reduced. The technical effects of the specific angle "a" are described in detail below with reference to FIGS. 13 to 24.

Figure 28:
FIG. 28 is an actual photograph of the light-emitting device package shown in FIGS. 1 to 5.

FIG. 28 is an actual photograph of the light-emitting device package shown in FIGS. 1 to 5, and FIGS. 29 to 32 are data showing simulation effects when light is emitted by the light-emitting device package of FIG. 28.

Figure 33:
FIG. 33 is an actual photograph of the light-emitting device package shown in FIG. 26.

FIG. 33 is an actual photograph of the light-emitting device package shown in FIG. 26, and FIGS. 34 to 37 are data showing simulation effects when light is emitted by the light-emitting device package of FIG. 33.

Figure 29:
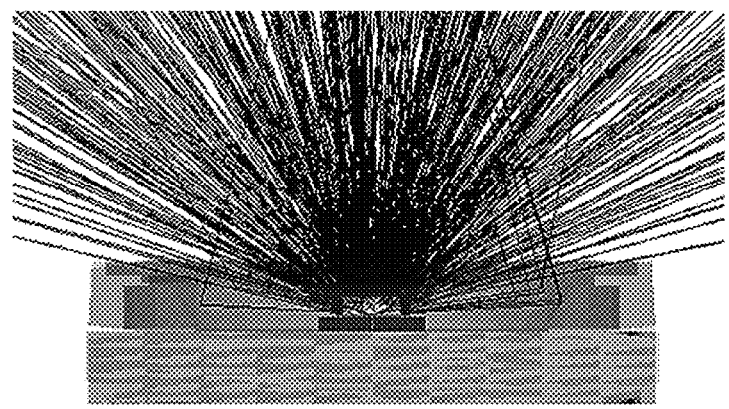
FIGS. 29 to 32 are data showing simulation effects when light is emitted by the light-emitting device package of FIG. 28.
Figure 30:
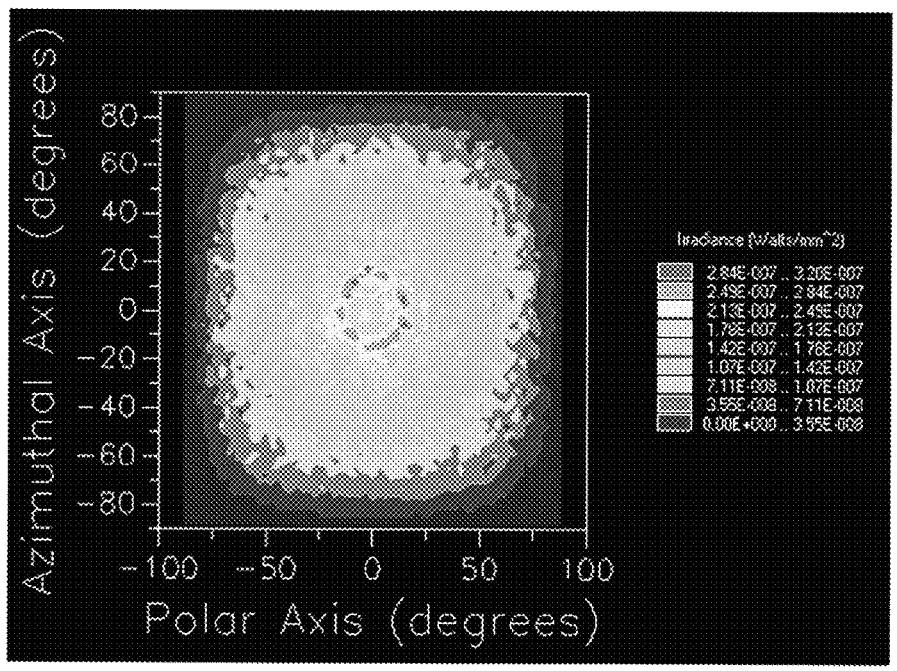
Figure 31:
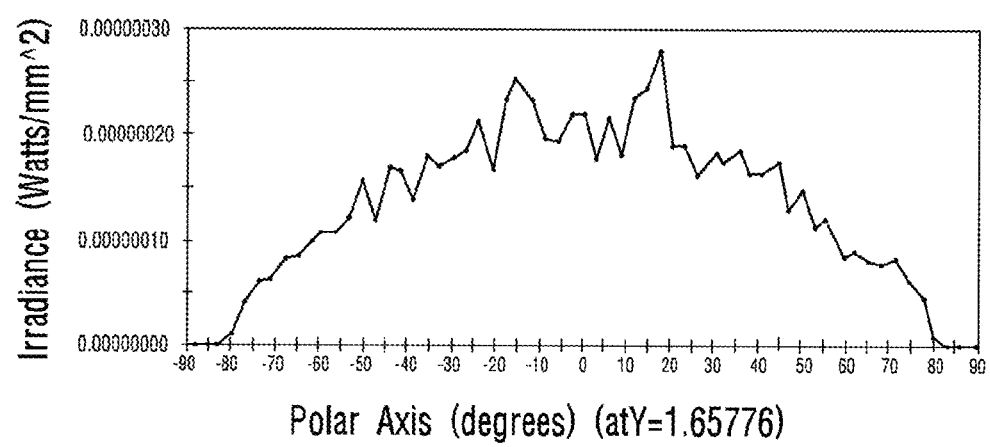
Figure 32:
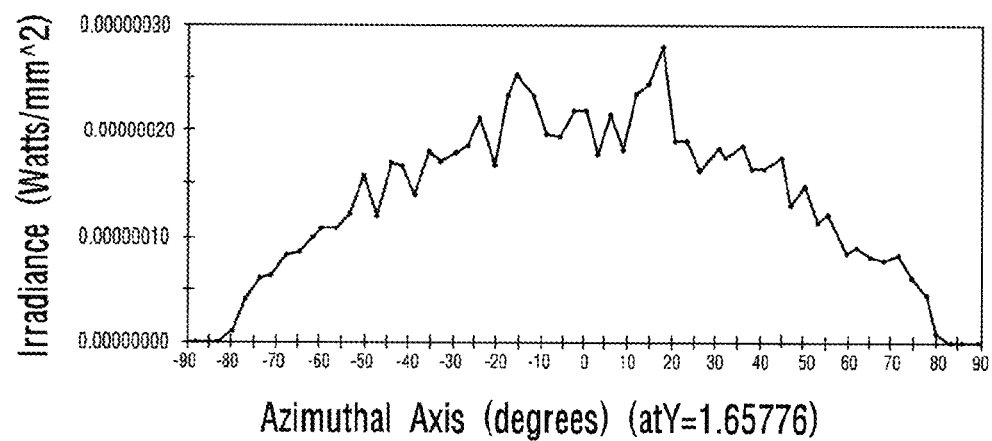
Figure 34:
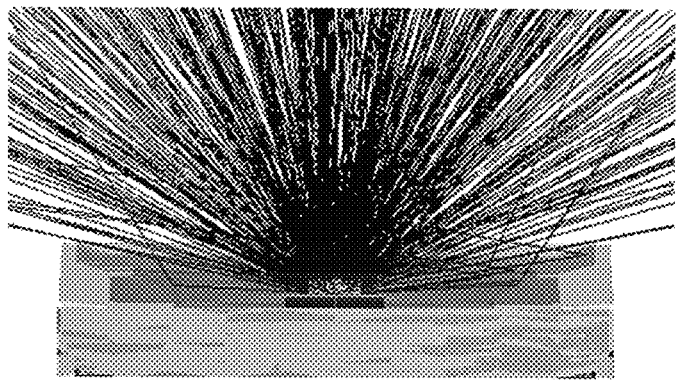
FIGS. 34 to 37 are data showing simulation effects when light is emitted by the light-emitting device package of FIG. 33.
Figure 35:
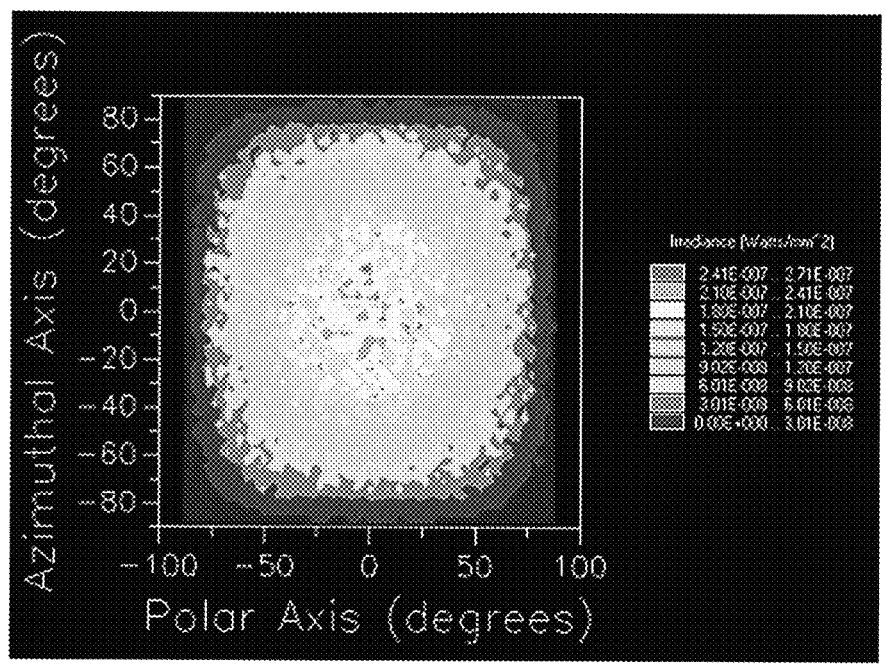
Figure 36:
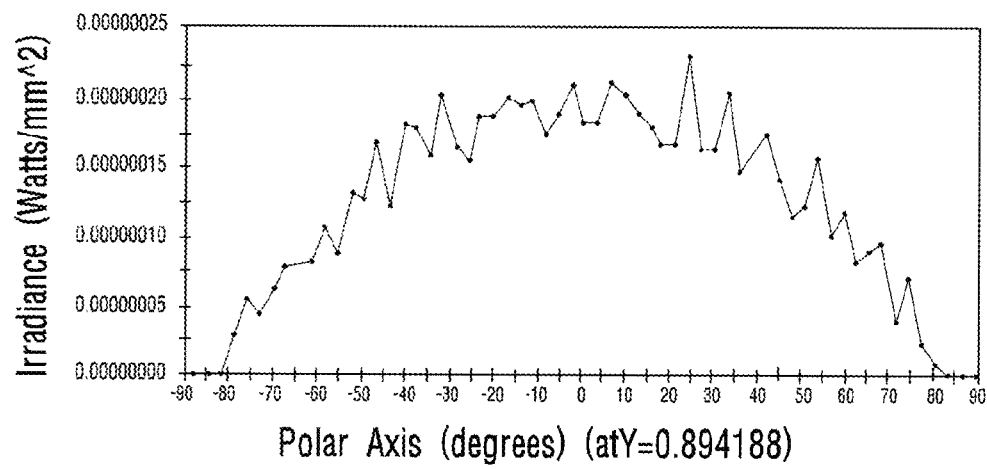
Figure 37:
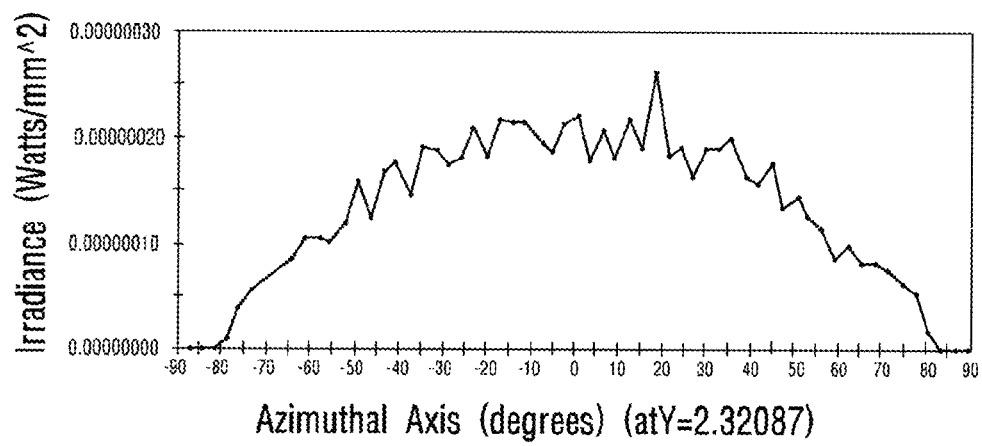

In FIGS. 29 and 34, the number of rays was set to 100,000. From a comparison between FIGS. 29 and 34, it may be seen that the density of rays in the central part of the light-emitting device package shown in FIG. 34 is smaller than the density of rays in the central part of the light-emitting device package shown in FIG. 29. This means that in the light-emitting device package of FIG. 34, backlight is not dense in the central part, and it may be seen that generally uniform backlight is formed.

Table 1 below shows optical output Po, operating voltages Vf, and peak wavelengths Wp of the light-emitting device package shown in FIG. 28.

TABLE 1

| | Po (@100 mA) | | $V_F$ (@100 mA) | | $W_P$ (@100 mA) |
|---|---|---|---|---|---|
| Max. | 11.618 | Max. | 6.624 | Max. | 275.08 |
| Avg. | 11.166 | Avg. | 6.485 | Avg. | 274.42 |

Table 2 below shows optical output Po, operating voltages Vf, and peak wavelengths Wp of the light-emitting device package shown in FIG. 33.

TABLE 2

| | Po (@100 mA) | | $V_F$ (@100 mA) | | $W_P$ (@100 mA) |
|---|---|---|---|---|---|
| Max. | 11.549 | Max. | 6.760 | Max. | 275.70 |
| Avg. | 11.220 (+0.48%) | Avg. | 6.519 | Avg. | 274.64 |

From Table 1 and Table 2, it may be seen that the optical output Po of the light-emitting device package shown in FIG. 33 is better than the optical output Po of the light-emitting device package shown in FIG. 28 in an average (Avg.) of 0.48.

From a comparison between FIGS. 30 to 32 and FIGS. 35 to 37, it may be seen that a backlight spot of a ring shape is generated in the central part of the light-emitting device package shown in FIG. 28 and a backlight spot of a specific shape is not generated in the light-emitting device package of FIG. 33 although no backlight spot is not present.

Figure 38:
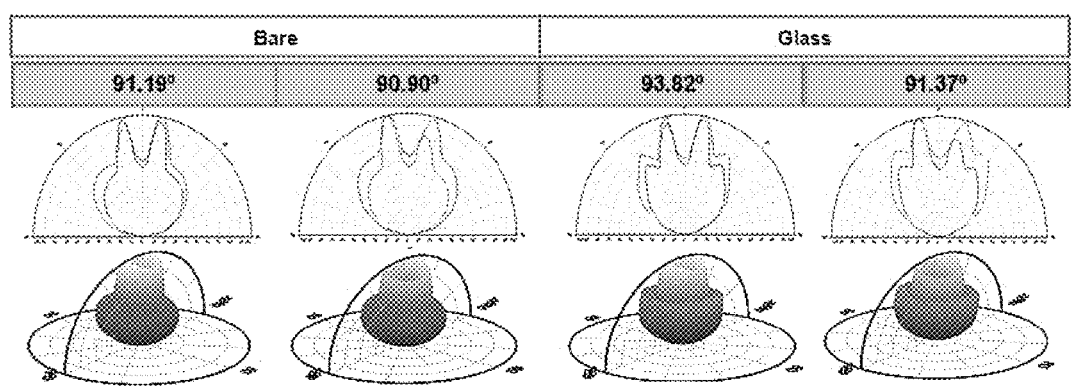
FIG. 38 is a diagram showing light directivity when light is emitted by the light-emitting device package of FIG. 28.
Figure 39:
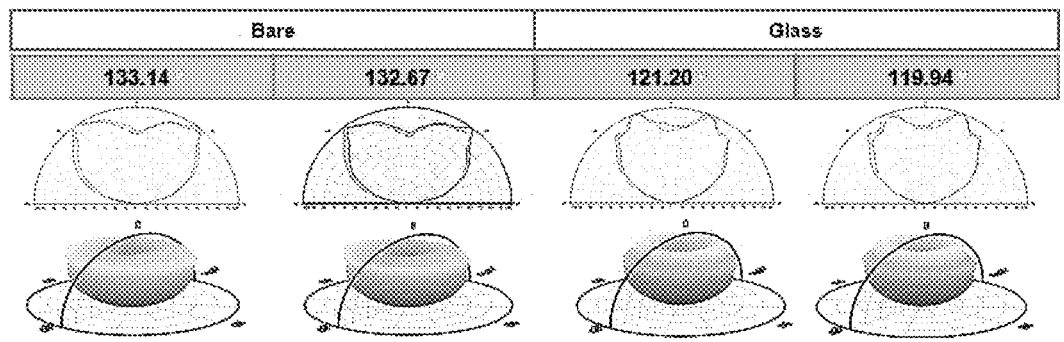
FIG. 39 is a diagram showing light directivity when light is emitted by the light-emitting device package of FIG. 33.

FIG. 38 is a diagram showing light directivity when light is emitted by the light-emitting device package of FIG. 28, and FIG. 39 is a diagram showing light directivity when light is emitted by the light-emitting device package of FIG. 33.

From a comparison between FIGS. 38 and 39, it may be seen that the light-emitting device package of FIG. 33 has better light directivity than the light-emitting device package of FIG. 28. Specifically, it may be seen that the light-emitting device package of FIG. 33 has uniform backlight compared to the light-emitting device package of FIG. 28.

Furthermore, although not shown in the drawings, if the specific angle "a" is less than 25 degrees, it is difficult to perform a reflection perform and the size of the light-emitting device package may be adversely affected. If the specific angle "a" is less than 25 degrees, the size of the reflector layer 140' is horizontally increased. If the size of the reflector layer 140' is increased, there is a problem in that the space on which the light-emitting device 100 may be mounted is narrowed if the size of the resin package 320 is fixed to a specific size. Furthermore, there is a problem in that the size of the package body has to be increased if a specific number of the light-emitting devices 100 has to be mounted on the resin package 320.

The specific angle "a" of the inclined surface 141' of the reflector layer 140' may be 25 degrees or more to 35 degrees or less by taking the aforementioned problems into consideration.

The embodiments have been chiefly described, but they are only examples. Those skilled in the art to which the present invention pertains may understand that various modifications and applications not described above are possible without departing from the essential characteristics of the present embodiment. For example, each of the elements described in the embodiments may be modified and implemented. Differences related to such modifications and applications should be construed as falling within the scope of the present invention defined by the appended claims.

What is claimed is:

1. A light-emitting device package, comprising:
   a package body comprising a top surface, a plate guide unit disposed on the top surface, and a cavity formed in the top surface;
   a light-emitting device disposed within the cavity;
   a plate disposed on the top surface of the package body and guided by the plate guide unit; and
   an adhesive member disposed between the top surface of the package body and the plate,
   wherein the adhesive member comprises:
      a base layer made of a flexible material;
      a first adhesive tape disposed between the base layer and the top surface of the package body and bonded to the base layer and the top surface of the package body; and
      a second adhesive tape disposed between the base layer and the plate and bonded to the base layer and the plate,
   wherein a top surface of the adhesive member is bonded to the plate, and a bottom surface of the adhesive member is bonded to the top surface of the package body,
   wherein a side surface of the adhesive member and a side surface of the plate guide unit are spaced apart from each other at a first interval,
   wherein a distance of the first interval is smaller than a distance of a second interval at which the side surface of the plate guide unit and a side surface of the plate are spaced apart from each other, and
   wherein an angle between the side surface of the plate guide unit and the top surface of the package body is an obtuse angle.

2. The light-emitting device package of claim 1, wherein the base layer of the adhesive member is made of a rubber material.

3. The light-emitting device package of claim 1, wherein:
   the top surface of the package body is made of an acrylic material, and
   the plate is made of a glass material.

4. The light-emitting device package of claim 1, wherein the first adhesive tape comprises a material that corresponds to a material of the top surface of the package body, and
   wherein the second adhesive tape comprises a material that corresponds to a material of the plate.

5. The light-emitting device package of claim 1, wherein a thickness of the adhesive member is 0.15 mm or more to 1.0 mm or less.

6. A light-emitting device package, comprising:
   a package body comprising a top surface, a plate guide unit disposed on the top surface, and a cavity formed in the top surface;
   a light-emitting device disposed within the cavity;
   a plate disposed on the top surface of the package body and guided by the plate guide unit;
   an internal adhesive member disposed between the top surface of the package body and the plate; and
   an external adhesive member disposed on the plate guide unit and the plate,
   wherein the internal adhesive member comprises:
      a first base layer made of a flexible material;
      a first adhesive tape disposed between the first base layer and the top surface of the package body and bonded to the first base layer and the top surface of the package body; and
      a second adhesive tape disposed between the first base layer and the plate and bonded to the first base layer and the plate, and wherein the external adhesive member comprises:
   a second base layer made of a flexible material; and
   an adhesive tape disposed below the second base layer and bonded to the plate guide unit and the plate.

7. The light-emitting device package of claim 6, wherein the adhesive tape comprises a material that corresponds to a material of the plate guide unit or a material of the plate.

8. The light-emitting device package of claim 6, wherein the second base layer of the external adhesive member is made of a rubber material.

9. The light-emitting device package of claim 6, wherein:
   the top surface of the package body is made of an acrylic material, and
   the plate is made of a glass material.

* * * * *